United States Patent
Kim

(10) Patent No.: US 11,557,349 B2
(45) Date of Patent: Jan. 17, 2023

(54) MEMORY DEVICE AND METHOD OF OPERATING THE MEMORY DEVICE

(71) Applicant: SK hynix Inc., Icheon-si (KR)

(72) Inventor: Jae Woong Kim, Icheon-si (KR)

(73) Assignee: SK hynix Inc., Icheon-si Gyeonggi-do (KR)

( * ) Notice: Subject to any disclaimer, the term of this patent is extended or adjusted under 35 U.S.C. 154(b) by 0 days.

(21) Appl. No.: 17/367,135

(22) Filed: Jul. 2, 2021

(65) Prior Publication Data

US 2022/0215887 A1   Jul. 7, 2022

(30) Foreign Application Priority Data

Jan. 6, 2021   (KR) .................. 10-2021-0001550

(51) Int. Cl.
*G11C 16/10* (2006.01)
*G11C 16/16* (2006.01)
*G11C 16/04* (2006.01)
*G11C 16/08* (2006.01)
*G11C 11/56* (2006.01)
*G11C 16/26* (2006.01)
*G11C 16/24* (2006.01)

(52) U.S. Cl.
CPC .......... *G11C 16/16* (2013.01); *G11C 11/5628* (2013.01); *G11C 11/5671* (2013.01); *G11C 16/0483* (2013.01); *G11C 16/08* (2013.01); *G11C 16/24* (2013.01); *G11C 16/26* (2013.01)

(58) Field of Classification Search
CPC ..................................... G11C 16/10
See application file for complete search history.

(56) References Cited

U.S. PATENT DOCUMENTS

2017/0242632 A1*   8/2017   Cho .................. G06F 16/902

FOREIGN PATENT DOCUMENTS

| KR | 1020140017290 A | 2/2014 |
| KR | 1020200070680 A | 6/2020 |
| KR | 102147359 B1 | 8/2020 |

* cited by examiner

*Primary Examiner* — Jason Lappas
(74) *Attorney, Agent, or Firm* — William Park & Associates Ltd.

(57) ABSTRACT

A memory device configured to perform a program operation and a backup operation together includes a memory block including a main sub block including selected memory cells in which program data is programmed among a plurality of memory cells respectively connected to a plurality of word lines, and a backup block in which page data included in the program data is backed up, a peripheral circuit configured to perform a plurality of program loops to program the program data in the selected memory cells, and control logic configured to control the peripheral circuit to back up any one of the page data while programming the selected memory cells in preset program loops among the plurality of program loops.

20 Claims, 15 Drawing Sheets

FIG. 9

| PL | 11 | 12 | 13 | 14 | 15 | 16 | 17 | 18 | 19 | 20 | 21 | 22 | 23 | 24 | 25 | 26 | 27 |
|---|---|---|---|---|---|---|---|---|---|---|---|---|---|---|---|---|---|
| PULSE | 1 | 2 | 3 | 4 | 5 | 6 | 7 | 8 | 9 | 10 | 11 | 12 | 13 | 14 | 15 | 16 | 17 |
| P1 | ● | ○ | ○ | ○ | ○ | – | – | – | – | – | – | – | – | – | – | – | – |
| P2 | – | – | ● | ○ | ○ | ○ | ○ | – | – | – | – | – | – | – | – | – | – |
| P3 | – | – | – | – | ● | ○ | ○ | ○ | ○ | – | – | – | – | – | – | – | – |
| P4 | – | – | – | – | – | – | – | ○ | ○ | ○ | ○ | ○ | – | – | – | – | – |
| P5 | – | – | – | – | – | – | – | – | ○ | ○ | ○ | ○ | ○ | – | – | – | – |
| P6 | – | – | – | – | – | – | – | – | – | – | ○ | ○ | ○ | ○ | ○ | – | – |
| P7 | – | – | – | – | – | – | – | – | – | – | – | – | ○ | ○ | ○ | ○ | ○ |

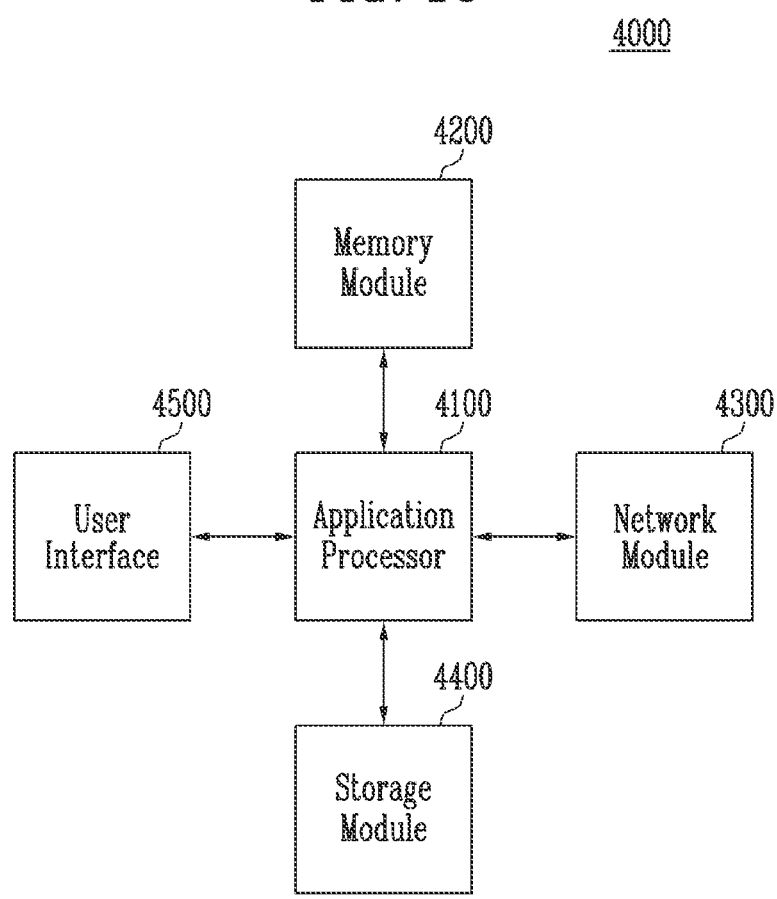

MEMORY DEVICE AND METHOD OF OPERATING THE MEMORY DEVICE

CROSS-REFERENCE TO RELATED APPLICATION

The present application claims priority under 35 U.S.C. § 119(a) to Korean patent application number 10-2021-0001550 filed on Jan. 6, 2021, in the Korean Intellectual Property Office, the entire disclosure of which is incorporated by reference herein.

BACKGROUND

1. Technical Field

The present disclosure relates to an electronic device, and more particularly, to a memory device and a method of operating the memory device.

2. Related Art

A storage device is a device that stores data under control of a host device such as a computer, a smart phone, or a smart pad. The storage device includes a device that stores data in a magnetic disk such as a hard disk drive (HDD), a device that stores data in a semiconductor memory such as a solid state drive (SSD), or a memory card, in particular, a nonvolatile memory.

The storage device may include a memory device in which data is stored and a memory controller that stores data in the memory device. The memory device may be classified into a volatile memory and a nonvolatile memory. Here, the nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like.

SUMMARY

According to an embodiment of the present disclosure, a memory device may include a memory block including a main sub block including selected memory cells in which program data is programmed among a plurality of memory cells respectively connected to a plurality of word lines, and a backup block in which page data included in the program data is backed up, a peripheral circuit configured to perform a plurality of program loops to program the program data in the selected memory cells, and control logic configured to control the peripheral circuit to back up any one of the page data while programming the selected memory cells in preset program loops among the plurality of program loops.

According to an embodiment of the present disclosure, a memory device may include a memory block including a main sub block including selected memory cells in which program data is programmed among a plurality of memory cells respectively connected to a plurality of word lines, and a backup block in which page data included in the program data is backed up, a peripheral circuit configured to perform a plurality of program loops to program the program data in the selected memory cells, an erase controller configured to control an erase operation on the backup blocks before the plurality of program loops are performed or after all of the plurality of program loops are performed, a program loop counter configured to count the number of times the plurality of program loops are performed, a mode setting component configured to set a program mode for programming the program data based on the number of program loops counted by the program loop counter, and a backup performing component configured to control the peripheral circuit to back up any one of the page data while programming the selected memory cells in preset program loops among the plurality of program loops.

According to an embodiment of the present disclosure, a method of operating a memory device comprising a memory block including a main sub block including selected memory cells in which program data is programmed among a plurality of memory cells respectively connected to a plurality of word lines, and backup blocks in which page data included in the program data is backed up may include performing a plurality of program loops to program the program data in the selected memory cells, and backing up any one of the page data while programming the selected memory cells when preset program loops among the plurality of program loops are performed.

BRIEF DESCRIPTION OF THE DRAWINGS

FIG. 9 illustrates a section in which a verify operation is performed when backup data is programmed.

FIG. 16 is a block diagram illustrating a user system to which a storage device according to an embodiment of the present disclosure is applied.

DETAILED DESCRIPTION

Specific structural or functional descriptions of embodiments according to the concept which are disclosed in the present specification or application are illustrated only to describe the embodiments according to the concept of the present disclosure. The embodiments according to the concept of the present disclosure may be carried out in various forms and should not be construed as being limited to the embodiments described in the present specification or application.

Hereinafter, embodiments of the present disclosure are described with reference to the accompanying drawings, so that those skilled in the art to which the present disclosure pertains may carry out the technical spirit of the present disclosure.

An embodiment of the present disclosure provides a memory device and a method of operating the memory device which may reduce time consumed for a backup operation by performing a program operation and a backup operation together.

According to the present technology, a backup operation may be performed without separately allocating a time for backup of data by backing up data in specific program loops among a plurality of program loops.

Figure 1:
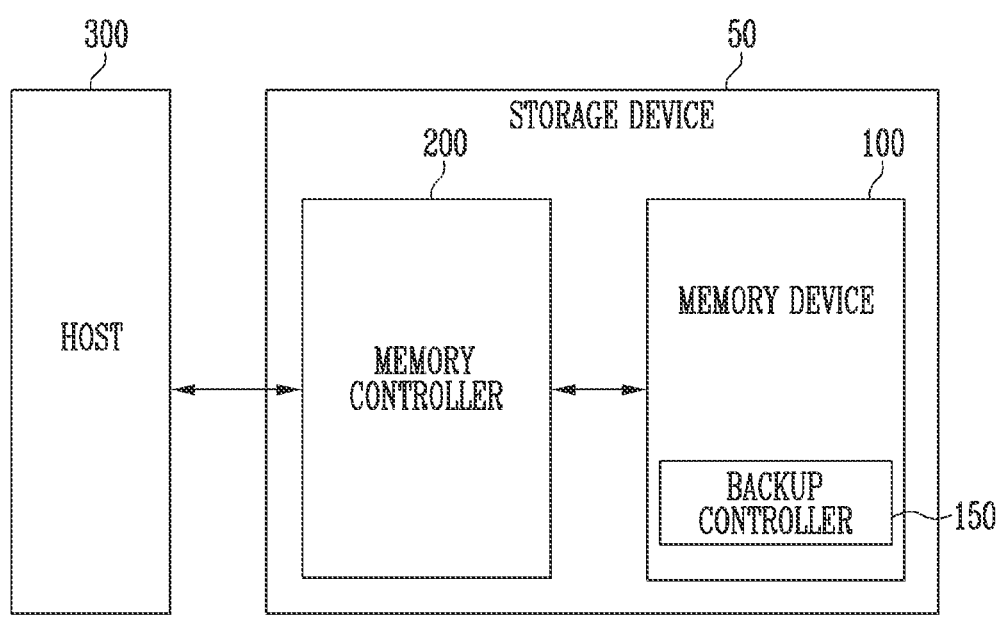
FIG. 1 is a block diagram illustrating a storage device.

FIG. 1 is a block diagram illustrating a storage device and host.

Referring to FIG. 1, the storage device 50 may include a memory device 100 and a memory controller 200.

The storage device 50 may be a device that stores data under control of the host 300 such as a cellular phone, a smartphone, an MP3 player, a laptop computer, a desktop computer, a game player, a TV, a tablet PC, or an in-vehicle infotainment system.

The storage device 50 may be manufactured as one of various types of storage devices according to a host interface that is a communication method with the host 300. For example, the storage device 50 may be configured as any one of various types of storage devices such as an SSD, a multimedia card in a form of an MMC, an eMMC, an RS-MMC and a micro-MMC, a secure digital card in a form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, and a memory stick.

The storage device 50 may be manufactured as any one of various types of packages. For example, the storage device 50 may be manufactured as any one of various types of packages, such as a package on package (POP), a system in package (SIP), a system on chip (SOC), a multi-chip package (MCP), a chip on board (COB), a wafer-level fabricated package (WFP), and a wafer-level stack package (WSP).

The memory device 100 may store data. The memory device 100 operates in response to control of the memory controller 200. The memory device 100 may include a memory cell array including a plurality of memory cells storing the data. The memory cell array may include a plurality of memory blocks. Each of the memory blocks may include a plurality of memory cells, and the plurality of memory cells may configure a plurality of pages. In an embodiment, a page may be a unit for storing data in the memory device 100 or reading data stored in the memory device 100. The memory block may be a unit for erasing data.

In an embodiment, the memory device 100 may be a double data rate synchronous dynamic random access memory (DDR SDRAM), a low power double data rate4 (LPDDR4) SDRAM, a graphics double data rate (DDDR) SDRAM, a low power DDR (LPDDR) SDRAM, a Rambus dynamic random access memory (RDRAM), a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (SIT-RAM), or the like. In the present specification, for convenience of description, it is assumed that the memory device 100 is a NAND flash memory.

The memory device 100 may be implemented as a two-dimensional array structure or a three-dimensional array structure. Hereinafter, the three-dimensional array structure is described as an embodiment, but the present disclosure is not limited to the three-dimensional array structure. The present disclosure may be applied not only to a flash memory device in which a charge storage layer is configured of a conductive floating gate (FG), but also to a charge trap flash (CTF) in which the charge storage layer is configured of an insulating film.

In an embodiment, the memory device 100 may operate in a single level cell (SLC) method in which one data bit is stored in one memory cell. Alternatively, the memory device 100 may operate in a method of storing at least two data bits in one memory cell. For example, the memory device 100 may operate in a multi-level cell (MLC) method of storing two data bits in one memory cell, a triple level cell (TLC) method of storing three data bits in one memory cell, or a quadruple level cell (QLC) method of storing four data bits in one memory cell.

The memory device 100 is configured to receive a command and an address from the memory controller 200 and access an area selected by the address in the memory cell array. That is, the memory device 100 may perform an operation corresponding to the command on the area selected by the address. For example, the memory device 100 may perform a write operation (program operation), a read operation, or an erase operation according to the received command. For example, when a program command is received, the memory device 100 may program data to the area selected by the address. When a read command is received, the memory device 100 may read data from the area selected by the address. When an erase command is received, the memory device 100 may erase data stored in the area selected by the address.

In an embodiment, the memory device 100 may include a backup controller 150. The backup controller 150 may back up program data when the memory device 100 performs a program operation.

For example, when the memory device 100 performs a program operation on a selected page among a plurality of pages included in the memory block, the backup controller 150 may back up the program data in the memory cells of the backup block. At this time, the memory cells of the backup block may be memory cells connected to the same word line as a selected word line to which the memory cells of the selected page are connected. In addition, the data programmed in the memory cells of the backup block may be some of the data to be programmed in the selected page, and may be programmed in a specific program pulse.

In an embodiment, the backup controller 150 backs up some or all data in the backup block, thereby preventing data loss due to a growing bad block (GBB) occurring during the program operation.

For example, when a program fail occurs during the program operation on the page of the memory device 100, the GBB may occur. As the GBB occurs, data of other pages in the memory block including the selected page may be lost together.

When the memory controller 200 controls the programming of data through an SLC buffer, some data may be recovered through data stored in the SLC buffer, but the number of pages that may be recovered is limited.

Therefore, in the present disclosure, a method in which the memory device 100 includes a selected memory block on which the program operation is performed and a backup block corresponding to the selected memory block, and the program data is backed up in the backup block when the memory device 100 performs the program operation on the selected memory block is presented. By backing up the program data in the backup block, even though the GBB occurs, data may be recovered based on the program data backed up in the backup block.

The memory controller 200 may control an overall operation of the storage device 50.

When a power voltage is applied to the storage device 50, the memory controller 200 may execute firmware. When the memory device 100 is a flash memory device, the memory controller 200 may operate firmware such as a flash translation layer (FTL) for controlling communication between the host 300 and the memory device 100.

In an embodiment, the memory controller 200 may include firmware (not shown) that may receive data and a logical block address (LBA) from the host 300 and translate the LBA into a physical block address (PBA) indicating an address of memory cells in which data included in the memory device 100 is to be stored. In addition, the memory controller 200 may store a logical-physical address mapping table configuring a mapping relationship between the LBA and the PBA in a buffer memory.

The memory controller 200 may control the memory device 100 to perform the program operation, the read operation, the erase operation, or the like according to the request of the host 300. For example, when a program request is received from the host 300, the memory controller 200 may convert the program request into a program command, and may provide the program command, the PBA, and data to the memory device 100. When a read request is received from the host 300 together with the LBA, the memory controller 200 may change the read request into a read command, select a PBA corresponding to the LBA, and then provide the read command and the PBA to the memory device 100. When an erase request is received from the host 300 together with the LBA, the memory controller 200 may change the erase request into an erase command, select a PBA corresponding to the LBA, and then provide the erase command and the PBA to the memory device 100.

In an embodiment, the memory controller 200 may generate and transmit the program command, the address, and the data to the memory device 100 without the request from the host 300. For example, the memory controller 200 may provide the command, the address, and the data to the memory device 100 to perform background operations such as a program operation for wear leveling and a program operation for garbage collection.

In an embodiment, the storage device 50 may further include a buffer memory (not shown). The memory controller 200 may control data exchange between the host 300 and the buffer memory (not shown). Alternatively, the memory controller 200 may temporarily store system data for controlling the memory device 100 in the buffer memory. For example, the memory controller 200 may temporarily store data input from the host 300 in the buffer memory, and then transmit data temporarily stored in the buffer memory to the memory device 100.

In various embodiments, the buffer memory may be used as an operation memory and a cache memory of the memory controller 200. The buffer memory may store codes or commands executed by the memory controller 200. Alternatively, the buffer memory may store data processed by the memory controller 200.

In an embodiment, the buffer memory may be implemented as a dynamic random access memory (DRAM) such as a double data rate synchronous dynamic random access memory (DDR SDRAM), a DDR4 SDRAM, a low power double data rate4 (LPDDR4) SDRAM, a graphics double data rate (DDDR) SDRAM, a low power DDR (LPDDR) SDRAM, or Rambus dynamic random access memory (RDRAM), or a static random access memory (SRAM).

In various embodiments, the buffer memory may be connected from an outside of the storage device 50. In this case, the volatile memory devices connected to the outside of the storage device 50 may serve as the buffer memory.

In an embodiment, the memory controller 200 may control at least two or more memory devices. In this case, the memory controller 200 may control the memory devices according to an interleaving method in order to improve operation performance.

The host 300 may communicate with the storage device 50 using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multi-media card (MMC), an embedded MMC (eMMC), a dual in-line memory module (DIMM), a registered DIMM (RDIMM), and a load reduced DIMM (LRDIMM).

Figure 2:
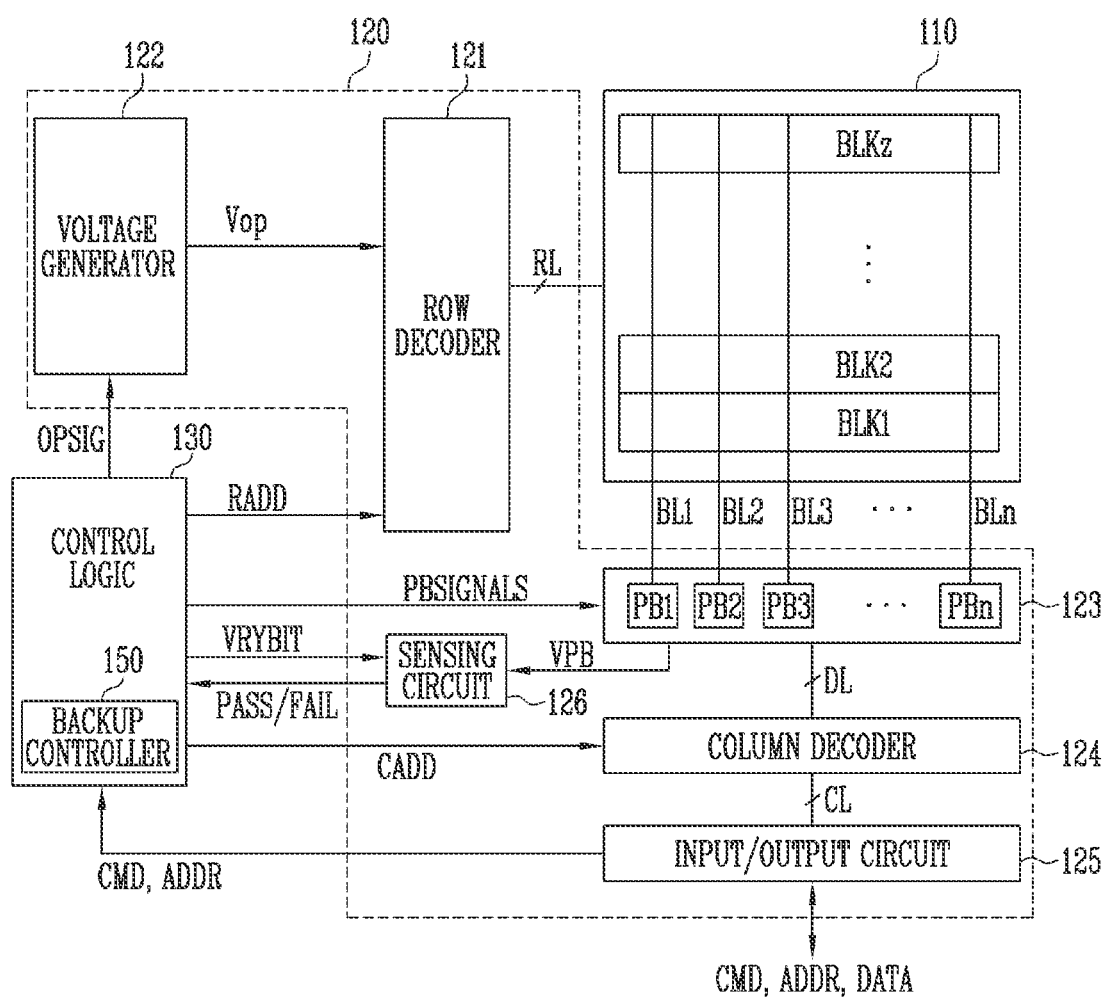
FIG. 2 is a diagram illustrating a structure of a memory device of FIG. 1.

FIG. 2 is a diagram illustrating a structure of the memory device of FIG. 1.

Referring to FIG. 2, the memory device 100 may include a memory cell array 110, a peripheral circuit 120, and control logic 130. The control logic 130 may be implemented as hardware, software, or a combination of hardware and software. For example, the control logic 130 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to a row decoder 121 through row lines RL. The plurality of memory blocks BLK1 to BLKz may be connected to the page buffer group 123 through bit lines BL1 to BLn. Each of the plurality of memory blocks BLK1 to BLKz includes a plurality of memory cells. As an embodiment, the plurality of memory cells are nonvolatile memory cells. Memory cells connected to the same word line may be defined as one page. Therefore, one memory block may include a plurality of pages.

The row lines RL may include at least one source select line, a plurality of word lines, and at least one drain select line.

Each of the memory cells included in the memory cell array 110 may be configured as an SLC that stores one data bit, an MLC that stores two data bits, a TLC that stores three data bits, or a QLC that stores four data bits.

The peripheral circuit 120 may be configured to perform the program operation, the read operation, or the erase operation on a selected area of the memory cell array 110 under control of the control logic 130. The peripheral circuit 120 may drive the memory cell array 110. For example, the peripheral circuit 120 may apply various operation voltages to the row lines RL and the bit lines BL1 to BLn or discharge the applied voltages under the control of the control logic 130.

The peripheral circuit 120 may include a row decoder 121, a voltage generator 122, the page buffer group 123, a column decoder 124, an input/output circuit 125, and a sensing circuit 126.

The row decoder 121 is connected to the memory cell array 110 through the row lines RL. The row lines RL may include at least one source select line, a plurality of word lines, and at least one drain select line. In an embodiment, the word lines may include normal word lines and dummy word lines. In an embodiment, the row lines RL may further include a pipe select line.

The row decoder 121 is configured to decode a row address RADD received from the control logic 130. The row decoder 121 selects at least one memory block among the memory blocks BLK1 to BLKz according to a decoded address. In addition, the row decoder 121 may select at least one word line of the memory block selected to apply the voltages generated by the voltage generator 122 to at least one word line WL according to the decoded address.

For example, during the program operation, the row decoder 121 may apply a program voltage to a selected word line and apply a program pass voltage of a level lower than the program voltage to an unselected word line. During a program verify operation, the row decoder 121 may apply a verify voltage to the selected word line and a verify pass voltage higher than the verify voltage to the unselected word line. During the read operation, the row decoder 121 may apply a read voltage to the selected word line and apply a read pass voltage higher than the read voltage to the unselected word line.

In an embodiment, the erase operation of the memory device 100 is performed in a memory block unit. During the erase operation, the row decoder 121 may select one memory block according to the decoded address. During the erase operation, the row decoder 121 may apply a ground voltage to the word lines connected to the selected memory block.

The voltage generator 122 operates in response to the control of the control logic 130. The voltage generator 122 is configured to generate a plurality of voltages using an external power voltage supplied to the memory device 100. For example, the voltage generator 122 may generate various operation voltages Vop used for the program, read, and erase operations, in response to an operation signal OPSIG. For example, the voltage generator 122 may generate the program voltage, the verify voltage, the pass voltage, the read voltage, the erase voltage, and the like in response to the control of the control logic 130.

As an embodiment, the voltage generator 122 may generate an internal power voltage by regulating the external power voltage. The internal power voltage generated by the voltage generator 122 is used as an operation voltage of the memory device 100.

As an embodiment, the voltage generator 122 may generate a plurality of voltages using the external power voltage or the internal power voltage.

For example, the voltage generator 122 may include a plurality of pumping capacitors that receive the internal power voltage, and may selectively activate the plurality of pumping capacitors to generate the plurality of voltages, in response to the control of the control logic 130.

The generated plurality of voltages may be supplied to the memory cell array 110 by the row decoder 121.

The page buffer group 123 includes first to nth page buffers PB1 to PBn. The first to n-th page buffers PB1 to PBn are connected to the memory cell array 110 through the first to n-th bit lines BL1 to BLn, respectively. The first to nth page buffers PB1 to PBn operate in response to the control of the control logic 130. For example, the first to n-th page buffers PB1 to PBn may operate in response to page buffer control signals PBSIGNALS. For example, the first to n-th page buffers PB1 to PBn may temporarily store data received through the first to n-th bit lines BL1 to BLn, or may sense a voltage or a current of the bit lines BL1 to BLn during the read or verify operation.

For example, during the program operation, when the program voltage is applied to the selected word line, the first to nth page buffers PB1 to PBn may transfer data DATA received through the input/output circuit 125 to the selected memory cells through the first to n-th bit lines BL1 to BLn. The memory cells of the selected page are programmed according to the transferred data DATA. During the program verify operation, the first to nth page buffers PB1 to PBn may read page data by sensing the voltage or the current received from the selected memory cells through the first to n-th bit lines BL1 to BLn.

During the read operation, the first to n-th page buffers PB1 to PBn read the data DATA from the memory cells of the selected page through the first to n-th bit lines BL1 to BLn, and outputs the read data DATA to the input/output circuit 125 under control of the column decoder 124.

During the erase operation, the first to n-th page buffers PB1 to PBn may float the first to n-th bit lines BL1 to BLn or apply the erase voltage.

The column decoder 124 may transfer data between the input/output circuit 125 and the page buffer group 123 in response to a column address CADD. For example, the column decoder 124 may exchange data with the first to n-th page buffers PB1 to PBn through data lines DL, or may exchange data with the input/output circuit 125 through column lines CL.

The input/output circuit 125 may transfer the command CMD and the address ADDR received from the memory controller 200 of FIG. 1 described with reference to FIG. 1 to the control logic 130, or may exchange data DATA with the column decoder 124.

The sensing circuit 126 may generate a reference current in response to a permission bit signal VRYBIT during the read operation or the verify operation, and compare a sensing voltage VPB received from the page buffer group 123 with a reference voltage generated by the reference current to output a pass signal PASS or a fail signal FAIL.

The control logic 130 may output the operation signal OPSIG, the row address RADD, the page buffer control signals PBSIGNALS, and the permission bit signal VRYBIT in response to the command CMD and the address ADDR to control the peripheral circuit 120. For example, the control logic 130 may control the read operation of the selected memory block in response to a sub block read command and the address. In addition, the control logic 130 may control the erase operation of the selected sub block included in the selected memory block in response to the sub block erase command and the address. In addition, the control logic 130 may determine whether the verity operation is passed or failed in response to the pass signal PASS or the fail signal FAIL.

In an embodiment, the control logic 130 may include the backup controller 150. In another embodiment, the backup controller 150 may be included outside the control logic 130.

In an embodiment, the backup controller 150 may change a program mode to a backup program mode in a specific program loop among program loops performed when the memory device 100 performs the program operation. In the backup program mode, the backup controller 150 may control the memory device 100 so that the program loop and a backup operation are simultaneously performed. Therefore, some of data to be programmed in the selected page may be backed up to the backup block simultaneously with performing the program operation on the selected page.

Here, when the memory device 100 performs the program operation in the MLC method, the data to be programmed in the selected page may be a least significant bit (LSB) page data and a most significant bit (MSB) page data. When the memory device 100 performs the program operation in the TLC method, the data to be programmed in the selected page may be a least significant bit (LSB) page data, a center significant bit (CSB) page data, and a most significant bit (MSB) page data.

In an embodiment, the number of backup blocks may be the same as the number of the data to be programmed in the selected page. In addition, the data to be backed up in the backup block may be programmed in the SLC method.

In an embodiment, the backup controller 150 may set a read voltage level for reading the backed up data when a program is faded. For example, when the memory device 100 performs the program operation in the (TLC) method, the backup controller 150 may set a read voltage for reading each of the backed up LSB page data, CSB page data, and MSB page data.

Therefore, when the program fail occurs, the backup controller 150 may recover the program data by reading the backed up data with preset read voltages, and the memory device 100 may perform the program operation again based on the recovered data.

In an embodiment, the backup controller 150 may erase the backup block before the program operation is started or after the program operation is completed. For example, after the program operation is completed, since the backup of the program data is not required, the backup block may be erased. Alternatively, the backup block may be erased in order to erase program data backed up in a previous program operation in which an operation is ended before the program operation is started.

As described above, since the memory device 100 performs the program operation and the backup controller 150 backs up the program data simultaneously, a time required for the backup operation may be included in a time consumed for the program operation. That is, a separate backup program time for the memory device 100 to back up the program data might not be consumed. The words "simultaneous" and "simultaneously" as used herein with respect to occurrences mean that the occurrences take place on overlapping intervals of time. For example, if a first occurrence takes place over a first interval of time and a second occurrence takes place simultaneously over a second interval of time, then the first and second intervals at least partially overlap each other such that there exists a time at which the first and second occurrences are both taking place.

As a result, through the above process, a time consumed for the program operation may be shortened.

Figure 3:
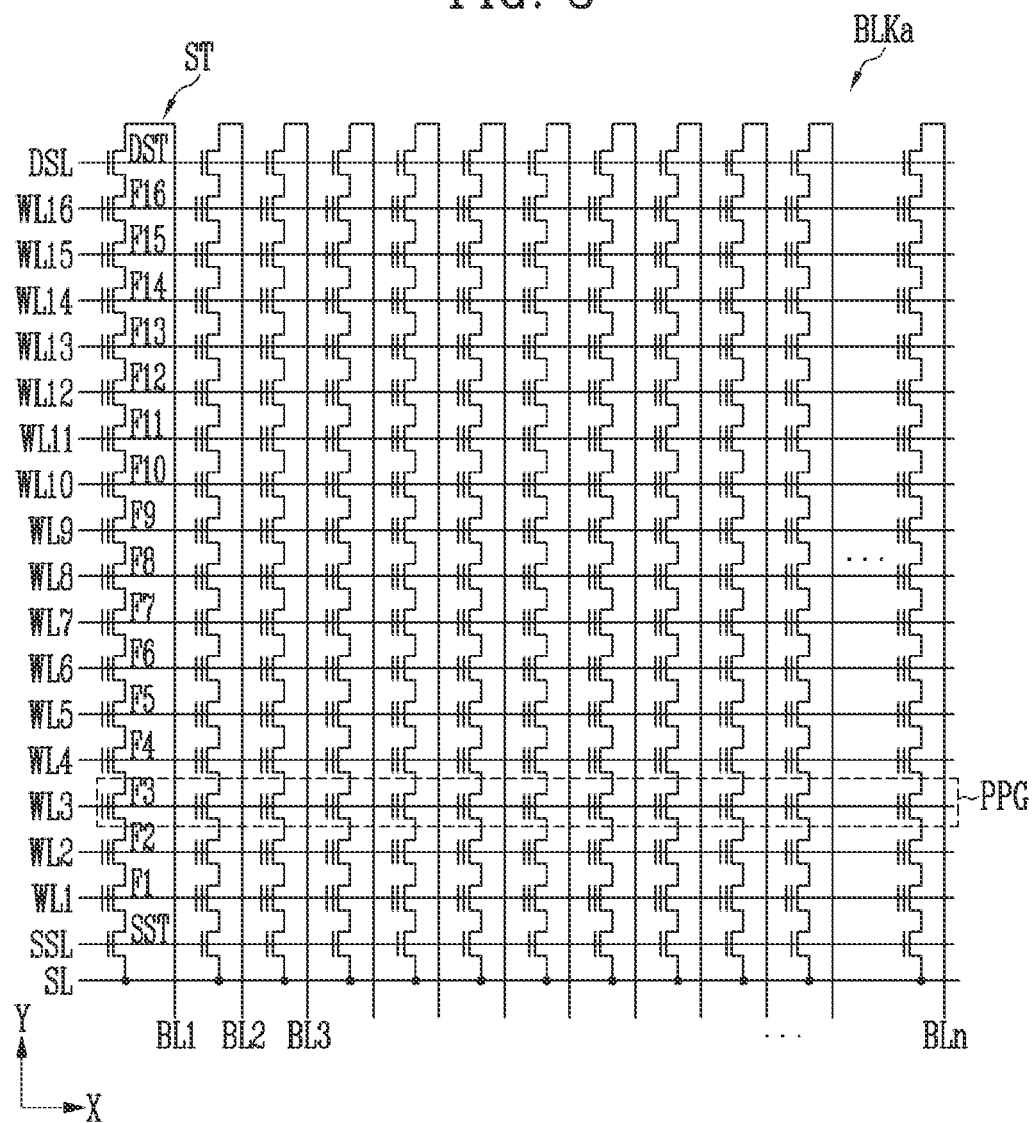
FIG. 3 is a diagram illustrating an embodiment of a memory cell array of FIG. 2.

FIG. 3 is a diagram illustrating an embodiment of the memory cell array of FIG. 2.

Referring to FIGS. 2 and 3, FIG. 3 is a circuit diagram showing any one memory block BLKa among the plurality of memory blocks BLK1 to BLKz included in the memory cell array 110 of FIG. 2.

A first select line, word lines, and a second select line arranged in parallel with each other may be connected to the memory block BLKa. For example, the word lines may be arranged in parallel with each other between the first and second select lines. Here, the first select line may be the source select line SSL, and the second select line may be the drain select line DSL.

For example, the memory block BLKa may include a plurality of strings connected between the bit lines BL1 to BLn and a source line SL. The bit lines BL1 to BLn may be connected to the strings, respectively, and the source line SL may be commonly connected to the strings. Since the strings may be configured to be identical to each other, a string ST connected to the first bit line BL1 is specifically described, as an example.

The string ST may include a source select transistor SST, a plurality of memory cells F1 to F16, and a drain select transistor DST connected in series between the source line SL and the first bit line BL1. One string ST may include at least one or more of the source select transistor SST and the drain select transistor DST, and may include the memory cells F1 to F16 more than the number shown in the drawing.

A source of the source select transistor SST may be connected to the source line SL and a drain of the drain select transistor DST may be connected to the first bit line BL1. The memory cells F1 to F16 may be connected in series between the source select transistor SST and the drain select transistor DST. Gates of the source select transistors SST included in the different strings may be connected to the source select line SSL, gates of the drain select transistors DST may be connected to the drain select line DSL, and gates of the memory cells F1 to F16 may be connected to a plurality of word lines WL1 to WL16. A group of the memory cells connected to the same word line among the memory cells included in different strings may be referred to as a physical page PPG. Therefore, the memory block BLKa may include the physical pages PPG of the number of the word lines WL1 to WL16.

One memory cell may store one bit of data. This is commonly referred to as an SLC. In this case, one physical page PPG may store one logical page (LPG) data. One logical page (LPG) data may include data bits of the number of memory cells included in one physical page PPG. In addition, one memory cell may store two or more bits of data. This is commonly referred to as an MLC. In this case, one physical page PPG may store two or more logical page (LPG) data.

A memory cell in which two or more bits of data are stored in one memory cell is referred to as the MLC, but recently, as the number of bits of data stored in one memory cell increases, the MLC refers to a memory cell in which two bits of data is stored, a memory cell in which three or more bits of data are stored is referred to as a triple level cell (TLC), and a memory cell in which four or more bits of data are stored is referred to as a quadruple level cell (QLC). In addition, a memory cell in which a plurality of bits of data are stored has been developed, and the present embodiment may be applied to the memory device 100 in which two or more bits of data are stored.

In another embodiment, the memory block may have a three-dimensional structure. Each memory block includes a plurality of memory cells stacked on a substrate. Such plurality of memory cells are arranged along a+X direction, a+Y direction, and a+Z direction.

Figure 4A:
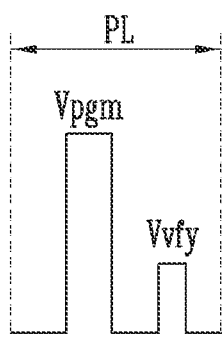
FIGS. 4A and 4B are diagrams illustrating a program loop and a process in which a memory cell is programmed.
Figure 4B:
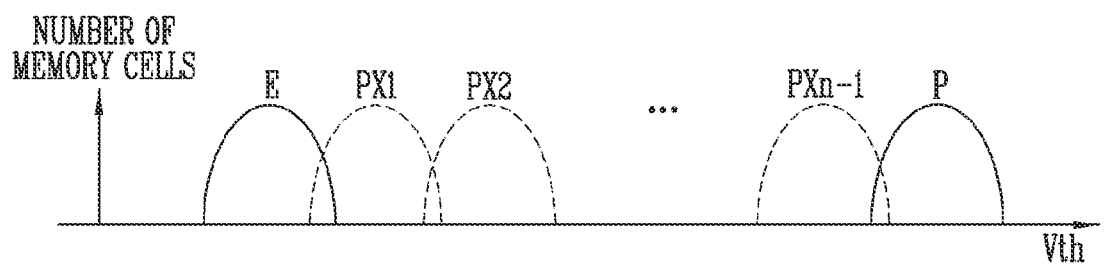

FIGS. 4A and 4B are diagrams illustrating a program loop and a process in which a memory cell is programmed.

Referring to FIGS. 4A and 4B, FIG. 4A shows any one of a plurality of program loops performed when the memory device 100 of FIG. 2 performs the program operation, and FIG. 4B shows a process in which the memory cells of an erase state are programmed to a target program state. In FIG. 4B, a horizontal axis represents a threshold voltage Vth of memory cells, and a vertical axis represents the number of memory cells.

In FIGS. 4A and 4B, it is assumed that the memory device 100 of FIG. 1 performs the program operation in the SLC method.

Referring to FIG. 4A, a program loop PL may be performed when the memory device 100 of FIG. 2 performs the program operation on the selected memory cells. The program loop PL may include a program pulse apply operation and a verify operation.

In an embodiment, the program puke apply operation may be an operation of applying a program voltage Vpgm to the selected word line to which the selected memory cells are connected. That is, the memory device 100 of FIG. 2 may program the selected memory cells by applying the program voltage Vpgm to the selected word line.

In an embodiment, the verify operation may be an operation of verifying whether the selected memory cells are programmed to the target program state through the program pulse apply operation. For example, the verify operation may be an operation of applying a verify voltage Vvfy to the selected word line to which the selected memory cells are connected. That is, it may be determined whether the selected memory cells are programmed to the target program state, based on data read by applying the verify voltage Vvfy to the selected word line.

Thereafter, when the verify operation is passed, the program loop PL may be ended, but when the verify operation is not passed and is failed, a next program loop may be performed. A program voltage applied to the selected word line in the next program loop may have a level greater than the program voltage Vpgm by a step voltage. That is, the next program loop may be performed in an incremental step pulse programming (ISPP) method.

After applying the voltage of the level greater than the program voltage Vpgm by the step voltage to the selected word line, it may be determined whether the selected memory cells are programmed to the target program state through the verify operation again.

Referring to FIG. 4B, FIG. 4B shows a threshold voltage distribution movement of the memory cells when the program loops are sequentially performed.

In an embodiment, the plurality of program loops may be performed when the program operation on the selected memory cells of the erase state E is performed. At this time, the memory cells of the erase state E may be programmed to the target program state P through various states.

In an embodiment, when the first program loop PL1 is performed on the selected memory cells, the threshold voltage distribution of the memory cells of the erase state E may be programmed to a PX1 distribution.

However, since the program of the memory cells of the erase state is not completed by the first program loop PL1, the second program loop PL2 may be performed after the first program loop PL1. When the second program loop PL2 is performed on the selected memory cells, the threshold voltage distribution of the memory cells may be changed from the PX1 distribution to a PX2 distribution.

Thereafter, in an n-th program loop PLn, the threshold voltage distribution of the selected memory cells may be changed from a PXn-1 distribution to a P distribution, Therefore, the selected memory cells may be programmed to the target program state through first to n-th program loops PL1 to PLn. In an embodiment, 'n' may be a positive integer.

When the program fail occurs while programming the selected memory cells through the above-described process, the GBB may occur. As the GBB occurs, data of other pages in the memory block including the selected page may be lost together. Therefore, in preparation for a case where the program fail occurs, the data to be programmed in the selected memory cells may be backed up.

However, since a separate program time for the backup data is consumed in order to back up the program data, the present disclosure presents a backup method that does not consume a separate program time by backing up the program data simultaneously with performing the program operation.

Figure 5:
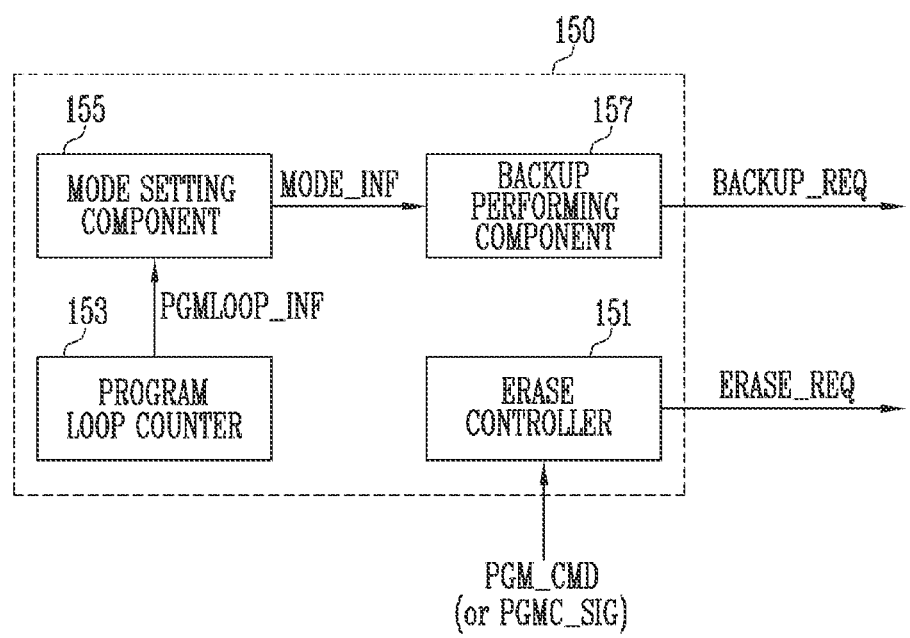
FIG. 5 illustrates a configuration of a backup controller.

FIG. 5 illustrates a configuration of a backup controller.

Referring to FIG. 5, the backup controller 150 of FIG. 5 may include an erase controller 151, a program loop counter 153, a mode setting component 155, and a backup performing component 157.

In an embodiment, the erase controller 151 may control erasure of the selected memory block including the selected memory cells and the backup block that backs up the program data to be programmed in the selected memory cells. At this time, the selected memory block and the backup block may be connected through the same word lines.

In an embodiment, the erase controller 151 may erase the selected memory block and the backup block after receiving a program command PGM_CMD from the memory controller 200 of FIG. 1. That is, before the program data is programmed in the selected memory cells included in the selected memory block, the selected memory block and the backup block may be erased. When receiving the program command PGM_CMD, the erase controller 151 may output an erase request ERASE_REQ for the selected memory block and the backup block, and the selected memory block and the backup block may be erased based on the erase request ERASE_REQ.

In another embodiment, the erase controller 151 may erase the backup block based on a program completion signal PGMC_SIG. Here, the program completion signal PGMC_SIG may be a signal output after the program operation is completed. That is, when the program operation on the selected memory cells is completed, since the program data is not required to be backed up in the backup block any more, the erase controller 151 may erase the backup block for the next program operation after the program operation is completed. When receiving the program completion signal PGMC_SIG, the erase controller 151 may output the erase request ERASE_REQ for the selected memory block and the backup block, and the selected memory block and the backup block may be erased based on the erase request ERASE_REQ.

In an embodiment, the program loop counter 153 may count the number of program loops performed when the memory device 100 of FIG. 1 performs the program operation, and output program loop information PGMLOOP_INF based on a counted result. For example, when the memory device 100 of FIG. 1 performs the program operation on the selected memory cells, the plurality of program loops may be performed, and the program loop counter 153 may count '1' each time the program loop is performed. When three program loops are performed in the memory device 100 of FIG. 1, the program loop information PGMLOOP_INF may be '3'.

In an embodiment, the mode setting component 155 may set the program mode based on the program loop information PGMLOOP_INF received from the program loop counter 153. At this time, the program mode may be a normal mode or a backup mode. The normal mode may be a program mode in which only the program operation is performed on the selected memory cells, and the backup mode may be a program mode in which the program data is backed up simultaneously with performing the program operation on the selected memory cells.

The mode setting component 155 may set the program mode as the backup mode in specific program loops. For example, when the memory device 100 of FIG. 1 performs the program operation in the TLC method, the program data may be the LSB page data, the CSB page data, and the MSB page data. Therefore, since the data to be backed up is three pieces of data, the mode setting component 155 may set the program mode as the backup mode in order to back up the above data in three specific program loops. The mode setting component 155 may set the backup mode in arbitrary specific program loops among the plurality of program loops performed in the memory device 100 of FIG. 1.

In an embodiment, the mode setting component 155 may output mode information MODE_INF for the set mode to the backup performing component 157.

In an embodiment, the backup performing component 157 may perform the backup operation based on the mode information MODE_INF received from the mode setting component 155. For example, when the mode information MODE_INF indicates the normal mode, the backup performing component 157 might not operate, and when the mode information MODE_INF indicates the backup mode, the backup performing component 157 may output a backup request BACKUP_REQ.

The memory device 100 of FIG. 1 may program the program data in the backup block simultaneously with programming the selected memory cells, based on the backup request BACKUP_REQ output from the backup performing component 157. At this time, the memory device 100 of FIG. 1 may back up the LSB page data, the CSB page data, and the MSB page data in preset specific program loops.

Figure 6:
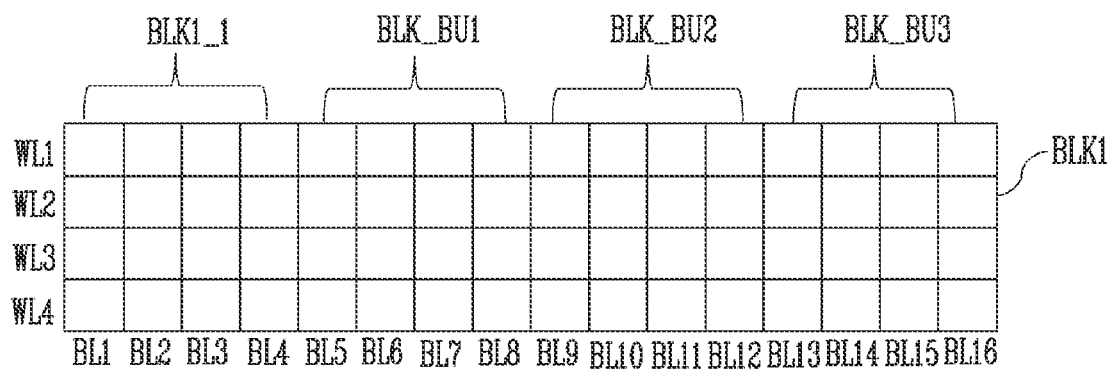
FIG. 6 is a diagram illustrating a backup block and a method of backing up data in the backup block.

FIG. 6 is a diagram illustrating a backup block and a method of backing up data in the backup block.

Referring to FIGS. 2 and 6, FIG. 6 illustrates a portion of the first memory block BLK1 of FIG. 2. In FIG. 6, it is assumed that the first memory block BLK1 is connected to the first to fourth word lines WL1 to WL4 and the first to sixteenth bit lines BL1 to BL16. In addition, in FIG. 6, one memory cell may exist at a point where one word line and one bit line intersect. The first memory block BLK1 may include a (1_1)-th memory block BLK1_1 and first to third backup blocks BLK_BU1 to BLK_BU3 which are sub blocks.

In FIG. 6, it is assumed that the first word line WL1 is the selected word line, and the memory cells included in the (1_1)-th memory block BLK1_1 which is the selected memory block among the memory cells connected to the first word line WL1 are the selected memory cells on which the program operation is performed. That is, among the memory cells connected to the first word line WL1, the memory cells connected to the first to fourth bit lines BL1 to BL4, respectively, may be the selected memory cells. The (1_1)-th memory block BLK1_1 may be a main sub block in which the program operation is performed.

In FIG. 6, it is assumed that the memory device 100 of FIG. 2 performs the program operation in the TLC method. Therefore, the program data to be programmed in the selected memory cells may include the LSB page data, the CSB page data, and the MSB page data.

As a result, the first memory block BLK1 may include (1_1)-th memory block on which the program operation is performed, and the first to third backup blocks BLK_BU1 to BLK_BU3 in which the program data programmed in the (1_1)-th memory block BLK1_1 is backed up. That is, since the number of the data required to be backed up is three, the backup block may be configured of the first to third backup blocks BLK_BU1 to BLK_BU3, which are three backup blocks. Here, the (1_1)-th memory block BLK1_1 and the first to third backup blocks BLK_BU1 to BLK_BU3 may be sub blocks of the first memory block BLK1, and the (1_1)-th memory block BLK1_1 and the first to third backup blocks BLK_BU1 to BLK_BU3 may be the sub blocks connected to the first to fourth word lines WL1 to that is, the same word lines.

In an embodiment, the plurality of program loops may be performed on the selected memory cells included in the (1_1)-th memory block BLK1_1 among the memory cells connected to the first word line WL1. Each of the plurality of program loops may include the program pulse apply operation and the verify operation.

In an embodiment, when the plurality of program loops are performed on the selected memory cells, the program data may be backed up in the memory cells connected to the first word line WL1 among the memory cells included in the first to third backup blocks BLK_BU1 to BLK_BU3 in specific program loops.

For example, assuming that the backup operation is performed simultaneously with the program operation in an eleventh program loop, a thirteenth program loop, and a fifteenth program loop among the plurality of program loops, when the eleventh program loop is performed on the selected memory cells, the MSB page data may be simultaneously programmed in the memory cells connected to the first word line WL1 among the memory cells included in the first backup block BLK_BU1. At this time, in order to program the MSB page data, the backup performing component 157 of FIG. 5 may control a voltage level of the fifth to eighth bit lines BL5 to BL8.

After the program operation and the backup operation are simultaneously performed through the eleventh program loop, a twelfth program loop may be performed. The twelfth program loop may include only an operation of programming the selected memory cells without the backup operation.

When the thirteenth program loop is performed after the twelfth program loop, the CSB page data may be simultaneously programmed in the memory cells connected to the first word line WL1 among the memory cells included in the second backup block BLK_BU2. At this time, in order to program the CSB page data, the backup performing component 157 of FIG. 5 may control a voltage level of the ninth to twelfth bit lines BL9 to BL12.

After the program operation and the backup operation are simultaneously performed through the thirteenth program loop, a fourteenth program loop may be performed. The fourteenth program loop may include only an operation of programming the selected memory cells without the backup operation.

When the fifteenth program loop is performed after the fourteenth program loop, the LSB page data may be simultaneously programmed in the memory cells connected to the first word line WL1 among the memory cells included in the third backup block BLK_BU3. At this time, in order to program the LSB page data, the backup performing component 157 of FIG. 5 may control a voltage level of thirteenth to sixteenth bit lines BL13 to BL16.

As a result, in the eleventh, thirteenth, and fifteenth program loops, since the backup operation is performed together with the program operation, a separate backup operation for backing up the program data might not be performed. Therefore, the time consumed for the program operation may be shortened.

Figure 7:
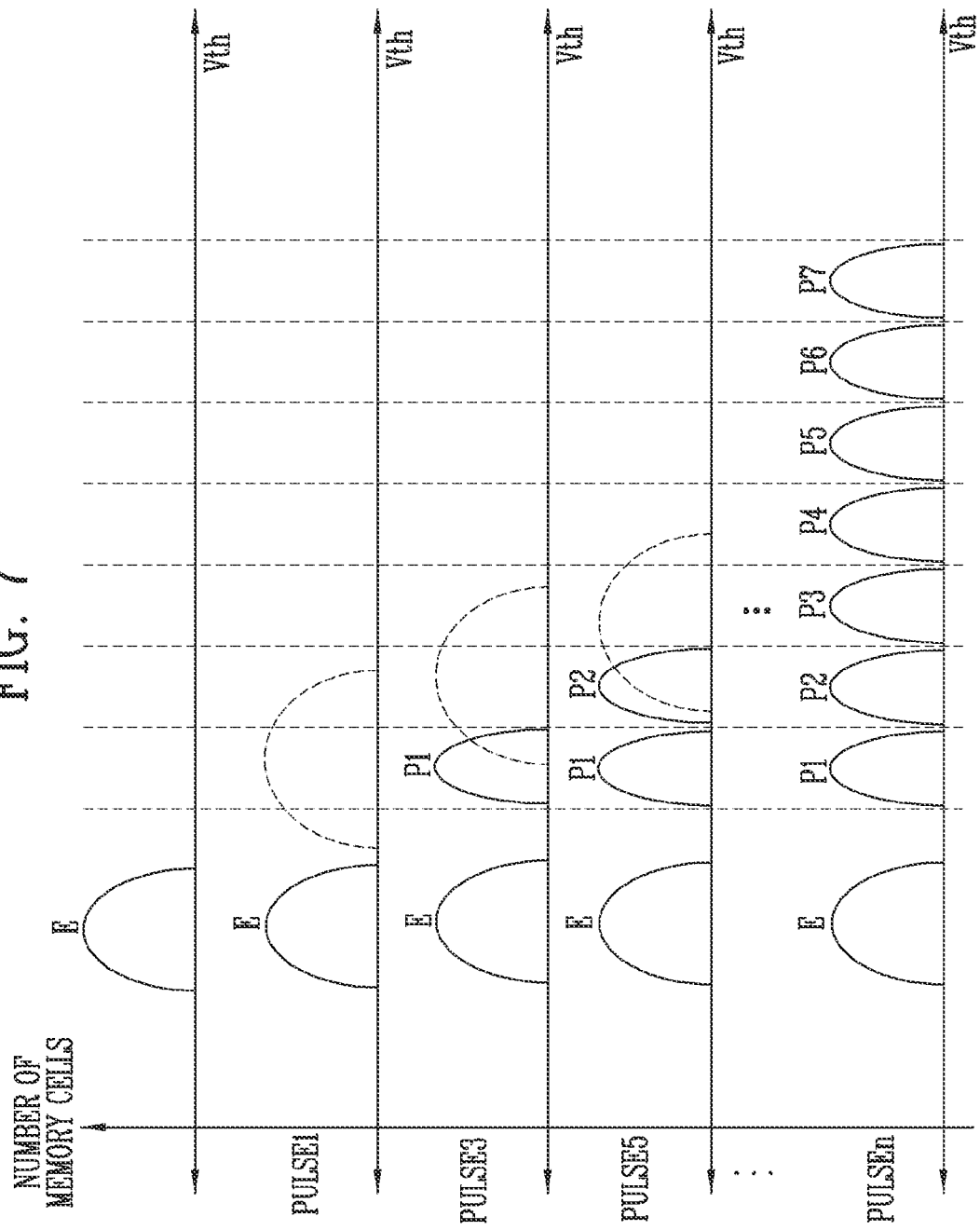
FIG. 7 illustrates a process in which selected memory cells are programmed when a program operation is performed in a triple level cell method.

FIG. 7 illustrates a process in which selected memory cells are programmed when a program operation is performed in a TLC method.

Referring to FIG. 7, FIG. 7 illustrates a threshold voltage distribution of the memory cells that change by the plurality of program loops performed when the memory device 100 of FIG. 2 performs the program operation in the TLC method. In FIG. 7, a horizontal axis represents a threshold voltage Vth of the memory cells, and a vertical axis represents the number of memory cells.

In an embodiment, when the memory device 100 of FIG. 2 performs the program operation on the selected memory cells, the plurality of program loops may be performed. Each of the plurality of program loops may include the program pulse apply operation and the verify operation. In each program loop, first to n-th program pulses PULSE1 to PULSEn may be applied to the selected word line. That is, program voltages corresponding to the first to n-th program pulses PULSE1 to PULSEn, respectively, may be applied to the selected word line. The program voltage may be a voltage for programming the selected memory cells to a target program state, and may be increased with the step voltage level.

Therefore, in order to program the selected memory cells from an erase state E to first to seventh program states P1 to P7, the first to n-th program pulses PULSE1 to PULSEn may be applied to the selected word line to which the selected memory cells are connected.

In an embodiment, as the first program pulse PULSE1 is applied to the selected word line, the program operation may be started. When the first program pulse PULSE1 is applied to the selected word line, the threshold voltage distribution of the selected memory cells of the erase state E may be increased.

In an embodiment, as the third program puke PULSE3 after the second program pulse PULSE2 is applied to the selected word line, the memory cells of which the target program state is the first program state P1 among the selected memory cells may be programmed to the first program state P1.

As the fifth program puke PULSE5 after the fourth program puke PULSE4 is applied to the selected word line, the threshold voltage of the selected memory cells is increased, and the memory cells of which the target program state is the second program state P2 among the selected memory cells may be programmed to the second program state P2.

Thereafter, as the sixth to n-th program pukes PULSE6 to PULSEn are sequentially applied to the selected word line, the selected memory cells may be programmed to the third to seventh program states P3 to P7, respectively, which are target program states.

In the present disclosure, when programming the selected memory cells, the backup operation may be performed in a specific program loop. For example, the backup operation may be performed in the eleventh, thirteenth, and fifteenth program loops among the plurality of program loops performed when programming the selected memory cells.

The change of the threshold voltage distribution of the memory cells included in the backup block during the backup operation is described with reference to FIG. 8.

Figure 8:
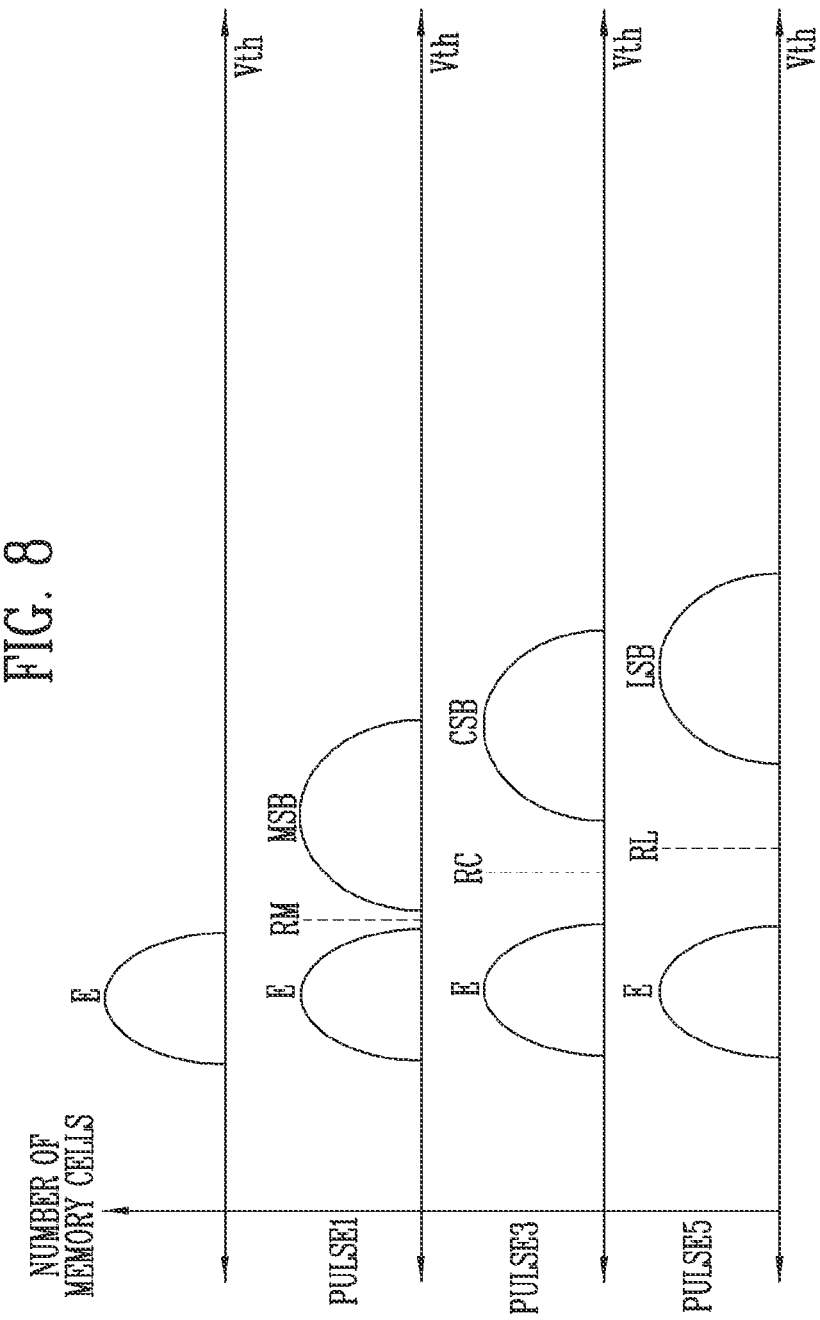
FIG. 8 illustrates a threshold voltage distribution of memory cells when programming backup data and a method of reading the backup data.

FIG. 8 illustrates a threshold voltage distribution of memory cells when programming backup data and a method of reading the backup data.

Referring to FIGS. 7 and 8, FIG. 8 illustrates a process in which the memory cells of the backup block are programmed when the first program puke PULSE1, the third program puke PULSE3, and the fifth program puke PULSE3 of FIG. 7 are applied to the selected word line. Referring to FIG. 6, the backup block is configured of the first to third backup blocks BLK_BU1 to BLK_BU3, and the first to third backup blocks BLK_BU1 to BLK_BU3 may be sub blocks connected to the first to fourth word lines WL1 to WL4, that is, the same word lines.

In FIG. 8 as in FIG. 7, it is assumed that the memory device 100 of FIG. 2 performs the program operation in the TLC method. Therefore, data to be programmed in the selected memory cells may be the LSB page data, the CSB page data, and the MSB page data. Since three pieces of data are programmed in the selected memory cells, the number of backup blocks may be three.

In an embodiment, referring to FIG. 6, among the memory cells connected to the first word line WL1, the plurality of program loops may be performed on the selected memory cells included in the (1_1)-th memory block BLK1_1. At this time, the backup operation may be performed on the memory cells included in the first to third backup blocks BLK_BU1 to BLK_BU3 among the memory cells connected to the first word line WL1.

For example, when the first program puke PULSE1 is applied to the first word line WL1, the MSB page data may be programmed in the SLC method in the memory cells of the first backup block BLK_BU1 among the memory cells connected to the first word line WL1. Thereafter, when the program fails, the MSB page data programmed in the first backup block BLK_BU1 may be read by an RM voltage. The RM voltage may be set in advance. The RM voltage may be a read voltage for distinguishing the erase state and the program state of the MSB page data.

When the third program puke PULSE3 is applied to the first word line WL1 after the first and second program pulses PULSE1 and PULSE2 are applied to the first word line WL1, the CSB page data may be programmed in the SLC method in the memory cells of the second backup block BLK_BU2 among the memory cells connected to the first word line WL1. Thereafter, when the program fails, the CSB page data programmed in the second backup block BLK_BU2 may be read by an RC voltage. The RC voltage may be set in advance. The RC voltage may be a read voltage for distinguishing the erase state and the program state of the CSB page data. In addition, a level of the RC voltage may be higher than a level of the RM voltage.

After the first to fourth program pukes PULSE1 to PULSE4 are applied to the first word line WL1, when the fifth program pulse PULSE5 is applied to the first word line WL1, the LSB page data may be programmed in the SLC method in the memory cells of the third backup block BLK_BU3 among the memory cells connected to the first word line WL1. Thereafter, when the program fails, the LSB page data programmed in the third backup block BLK_BU3 may be read by an RL voltage. The RL voltage may be set in advance. The RL voltage may be a read voltage for distinguishing the erase state and the program state of the LSB page data. In addition, a level of the RL voltage may be higher than a level of the RC voltage.

As a result, since the backup operation is performed together with the program operation in specific program loops among the plurality of program loops, a separate time might not be consumed for the backup operation. Therefore, the time consumed for the program operation is shortened, and all data to be programmed in the selected memory cells may be backed up in the memory cells included in each of the first to third backup blocks BLK_BU1 to BLK_BU3.

FIG. 9 illustrates a section in which a verify operation is performed when backup data is programmed.

Referring to FIGS. 7 to 9, FIG. 9 illustrates the verify operation performed in each program loop when the program operation is performed on the selected memory cells in the program method described with reference to FIGS. 7 and 8.

In an embodiment, when the memory device 100 of FIG. 2 performs the program operation in the TLC method, the target program state of the selected memory cells may be any one of the first to seventh program states P1 to P7.

In an embodiment, eleventh to twenty-seventh program loops PL11 to PL27 may be performed to program the selected memory cells to the target program state. The eleventh to twenty-seventh program loops PL11 to PL27 may include a program pulse apply operation and a verify operation of applying first to seventeenth program pulses PULSE1 to PULSE17 to the selected word line, respectively.

In an embodiment, when the eleventh program loop PL11 is performed on the selected memory cells, the program pulse apply operation in which the first program pulse PULSE1 is applied to the selected word line may be performed. Thereafter, the verify operation may be performed with a first verify voltage Vvfy1 to verify whether the memory cells of which the target program state is the first program state P1 are programmed.

Further, referring to FIGS. 7 and 8, the MSB page data among the LSB page data, the CSB page data, and the MSB page data, which are programmed in the selected memory cells, may be programmed in the backup block in the SLC method, simultaneously with performing the eleventh program loop PL11 on the selected memory cells. Therefore, the verify operation may be performed with the first verify voltage Vvfy1 to verify whether the MSB page data is backed up in the backup block.

In an embodiment, when the twelfth program loop PL12 is performed on the selected memory cells, the program pulse apply operation in which the second program pulse PULSE2 is applied to the selected word line may be performed. Thereafter, the verify operation may be performed with the first verify voltage Vvfy1 to verify whether the memory cells of which the target program state is the first program state P1 are programmed.

In an embodiment, when the thirteenth program loop PL13 is performed on the selected memory cells, the program pulse apply operation in which the third program pulse PULSE3 is applied to the selected word line may be performed. Differently from the twelfth program loop PL12, in the thirteenth program loop PL13, the verify operation may be performed with first and second verify voltages Vvfy1 and Vvfy2 to verify whether the memory cells of which the target program states are the first and second program states P1 and P2 are programmed.

Further, referring to FIGS. 7 and 8, the CSB page data among the LSB page data, the CSB page data, and the MSB page data, which are programmed in the selected memory cells, may be programmed in the backup block in the SLC method, simultaneously with performing the thirteenth program loop PL13 on the selected memory cells. Therefore, the verify operation may be performed with the second verify voltage Vvfy2 to verify whether the CSB page data is backed up in the backup block.

In an embodiment, when the fourteenth program loop PL14 is performed on the selected memory cells, the program pulse apply operation in which the fourth program pulse PULSE4 is applied to the selected word line may be performed. Thereafter, the verify operation may be performed with the first and second verify voltages Vvfy1 and Vvfy2 to verify whether the memory cells of which the target program states are the first and second program states P1 and P2 are programmed.

In an embodiment, when the fifteenth program loop PL15 is performed on the selected memory cells, the program pulse apply operation in which the fifth program pulse PULSE5 is applied to the selected word line may be performed. Differently from the fourteenth program loop PL14, in the fifteenth program loop PL15, the verify operation may be performed with first to third second verify voltages Vvfy1 to Vvfy3 to verify whether the memory cells of which the target program states are the first to third program states P1 to P3 are programmed.

Further, referring to FIGS. 7 and 8, the LSB page data among the LSB page data, the CSB page data, and the MSB page data, which are programmed in the selected memory cells, may be programmed in the backup block in the SLC method, simultaneously with performing the fifteenth program loop PL15 on the selected memory cells. Therefore, the verify operation may be performed with the third verify voltage Vvfy3 to verify whether the LSB page data is backed up in the backup block.

Through the above verify method, the memory device 100 of FIG. 2 may verify whether the selected memory cells are programmed to the target program state. Further, in the eleventh, thirteenth, and fifteenth program loops PL11, PL13, and PL15, it may be verified whether the MSB page data, the CSB page data, and the LSB page data are programmed in the backup block, respectively.

Thereafter, when the sixteenth program loop PL16 is performed on the selected memory cells, the verify operation may be performed with the second and third verify voltages Vvfy2 and Vvfy3, when the seventeenth program loop PL17 is performed on the selected memory cells, the verify operation may be performed with second to fourth verify voltages Vvfy2 to Vvfy4, when the eighteenth program loop PL18 is performed on the selected memory cells, the verify operation may be performed with the third and fourth verify voltages Vvfy3 and Vvfy4, when the nineteenth program loop PL19 is performed on the selected memory cells, the verify operation may be performed with third to fifth verify voltages Vvfy3 to Vvfy5, when the twentieth program loop PL20 is performed on the selected memory cells, the verify operation may be performed with the fourth and fifth verify voltages Vvfy4 and Vvfy5, when the twenty-first program loop PL21 is performed on the selected memory cells, the verify operation may be performed with fourth to sixth verify voltages Vvfy4 to Vvfy6, when the twenty-second program loop PL22 is performed on the selected memory cells, the verify operation may be performed with the fifth and sixth verify voltages Vvfy5 and Vvfy6, when the twenty-third program loop PL23 is performed on the selected memory cells, the verify operation may be performed with fifth to seventh verify voltages Vvfy5 to Vvfy7.

In addition, when each of the twenty-forth and twenty-fifth program loops PL24 and PL25 is performed on the selected memory cells, the verify operation may be performed with the sixth and seventh verify voltages Vvfy6 and Vvfy7, and when each of the twenty-sixth and twenty-seventh program loops PL26 and PL27 is performed on the selected memory cells, the verify operation may be performed with the seventh verify voltage Vvfy7.

Figure 10:
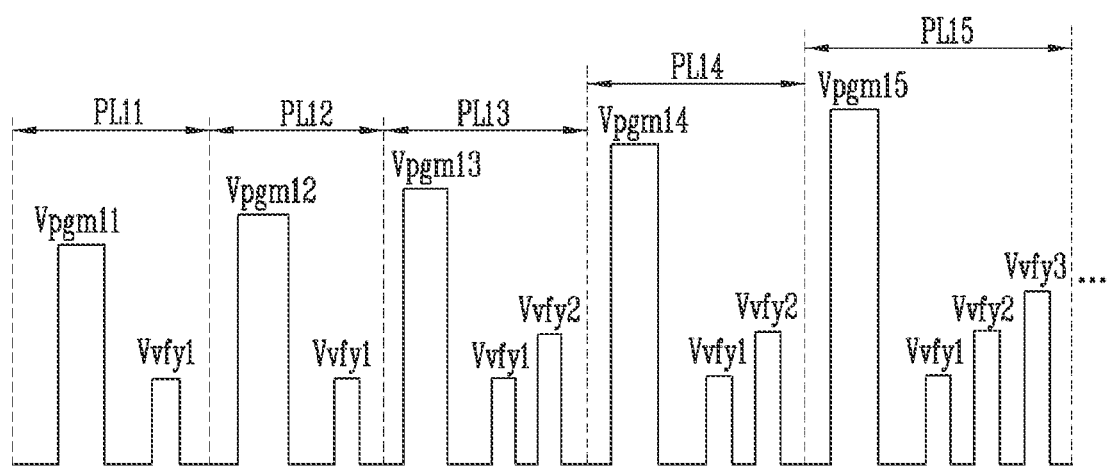
FIG. 10 illustrates program loops each including the verify operations of FIG. 9.

FIG. 10 illustrates program loops each including the verify operations of FIG. 9.

Referring to FIGS. 9 and 10, FIG. 10 illustrates some of the eleventh to twenty-seventh program loops PL11 to PL27 of FIG. 9. Each of the eleventh to twenty-seventh program loops PL11 to PL27 may include the program pulse apply operation of applying the program pulse to the selected word line and the verify operation. The program pulse apply operation may be an operation of applying the program voltage to the selected word line, and the verify operation may be an operation of applying the verify voltage to the selected word line.

In an embodiment, the eleventh program loop PL11 may be performed to program the selected memory cells. The eleventh program loop PL11 may include a program pulse apply operation of applying an eleventh program voltage Vpgm11 to the selected word line, and the verify operation of applying the first verify voltage Vvfy1.

Referring to FIGS. 7 and 8, the MSB page data among the LSB page data, the CSB page data, and the MSB page data, which are programmed in the selected memory cells, may be programmed in the backup block in the SLC method, simultaneously with performing the eleventh program loop PL11 on the selected memory cells.

Therefore, in order to verify whether the memory cells of which the target program state is the first program state P1 among the selected memory cells are programmed in the eleventh program loop PL11, the verify operation may be performed with the first verify voltage Vvfy1. In addition, in order to verify whether the MSB page data is programmed in the backup block, the verify operation may be performed with the first verify voltage Vvfy1.

In an embodiment, the twelfth program loop PL12 may be performed to program the selected memory cells. The twelfth program loop PL12 may include a program pulse apply operation of applying a twelfth program voltage Vpgm12 to the selected word line and the verify operation of applying the first verify voltage Vvfy1. The twelfth program voltage Vpgm12 may be a voltage of a level greater than that of the eleventh program voltage Vpgm11 by the step voltage. Therefore, in order to verify whether the memory cells of which the target program state is the first program state P1 among the selected memory cells are programmed after the application of the program puke in the twelfth program loop PL12, the verify operation may be performed with the first verify voltage Vvfy1.

In an embodiment, the thirteenth program loop PL13 may be performed to program the selected memory cells. The thirteenth program loop PL13 may include a program puke apply operation of applying a thirteenth program voltage Vpgm13 to the selected word line and the verify operation of applying the first and second verify voltages Vvfy1 and Vvfy2.

Referring to FIGS. 7 and 8, the CSB page data among the LSB page data, the CSB page data, and the MSB page data, which are programmed in the selected memory cells, may be programmed in the backup block in the SLC method, simultaneously with performing the thirteenth program loop PL13 on the selected memory cells.

Therefore, in order to verify whether the memory cells of which the target program states are the first and second program states P1 and P2 among the selected memory cells are programmed in the thirteenth program loop PL13, the verify operation may be performed with the first and second verify voltages Vvfy1 and Vvfy2. In addition, in order to verify whether the CSB page data is programmed in the backup block, the verify operation may be performed with the second verify voltage Vvfy2.

In an embodiment, the fourteenth program loop PL14 may be performed to program the selected memory cells. The fourteenth program loop PL14 may include a program pulse apply operation of applying a fourteenth program voltage Vpgm14 to the selected word line and the verify operation of applying the first and second verify voltages Vvfy1 and Vvfy2. The fourteenth program voltage Vpgm14 may be a voltage of a level greater than that of the thirteenth program voltage Vpgm13 by the step voltage. Therefore, in order to verify whether the memory cells of which the target program states are the first and second program states P1 and P2 among the selected memory cells are programmed after the application of the program puke in the fourteenth program loop PL14, the verify operation may be performed with the first and second verify voltages Vvfy1 and Vvfy2.

In an embodiment, the fifteenth program loop PL15 may be performed to program the selected memory cells. The fifteenth program loop PL15 may include a program puke apply operation of applying a fifteenth program voltage Vpgm15 to the selected word line and the verify operation of applying the first to third verify voltages Vvfy1 to Vvfy3.

Referring to FIGS. 7 and 8, the LSB page data among the LSB page data, the CSB page data, and the MSB page data, which are programmed in the selected memory cells, may be programmed in the backup block in the SLC method, simultaneously with performing the fifteenth program loop PL15 on the selected memory cells.

Therefore, in order to verify whether the memory cells of which the target program states are the first to third program states P1 to P3 among the selected memory cells are programmed in the fifteenth program loop PL15, the verify operation may be performed with the first to third verify voltages Vvfy1 to Vvfy3. In addition, in order to verify whether the LSB page data is programmed in the backup block, the verify operation may be performed with the third verify voltage Vvfy3.

In an embodiment, the plurality of program loops may be performed after the fifteenth program loop PL15 to program the selected memory cells.

Figure 11:
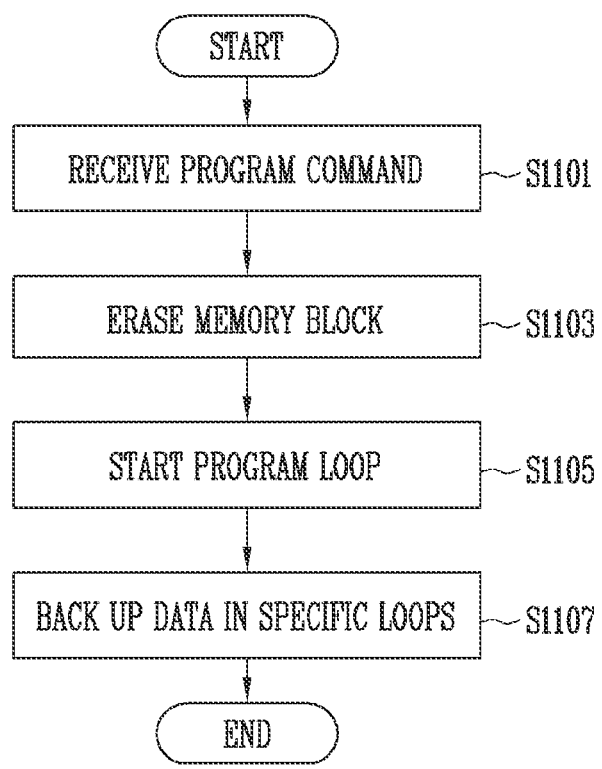
FIG. 11 is a diagram illustrating an operation of a memory device according to an embodiment of the present disclosure.

FIG. 11 is a diagram illustrating an operation of a memory device according to an embodiment of the present disclosure.

Referring to FIG. 11, in step S1101, the memory device may receive the program command from the memory controller. In an embodiment, the memory device may program the program data received together with the program command in the selected memory cells in response to the program command after step S1103. At step S1105, the memory device may perform the plurality of program loops to program the program data in the selected memory cells. Each of the plurality of program loops may include the program pulse apply operation and the verify operation.

In step S1103, the memory device may erase the memory block including the selected memory cells on which the plurality of program loops are to be performed. At this time, the memory block on which the erase operation is performed may include the main sub block, and the backup blocks connected to the main sub block through the same word lines. The main sub block may be a sub block including the memory cells in which the program data is programmed, and the backup block may be a sub block including the memory cells in which the program data is backed up. That is, before the plurality of program loops are performed, the memory device may erase the memory block.

In another embodiment, step S1103 may be performed after S1107. That is, after all of the selected memory cells are programmed to the target program state, the memory block may be erased. However, when step S1103 is performed after S1107, the data programmed in the selected memory cells are required not to be erased, and thus only the backup blocks among the sub blocks included in the memory block may be erased.

In step S1105, the memory device may start the program loop. The program loop may include the program pulse apply operation and the verify operation. Here, the program pulse apply operation may be an operation of applying the program voltage to the selected word line connected to the selected memory cells, and the verify operation may be an operation of verifying whether the selected memory cells are programmed to the target program state by applying the verify voltage to the selected word line.

In step S1107, the memory device may back up the data in the backup block in specific program loops. The number of backup blocks and the number of specific program loops may be determined according to the number of data programmed in the selected memory cells.

For example, when the memory device performs the program operation in the MLC method, since the data programmed in the selected memory cells is the LSB page data and the MSB page data, the number of backup blocks and the number of specific program loops may be '2'. When the memory device performs the program operation in the TLC method, since the data programmed in the selected memory cells is the LSB page data, the CSB page data, and the MSB page data, the number of backup blocks and the number of specific program loops may be '3'.

In an embodiment, when the specific program loops are performed, the memory device may sequentially program from the MSB page data in the SLC method.

For example, when the memory device performs the program operation in the MLC method, the LSB page data may be programmed after the MSB page data is programmed in the specific program loops. When the memory device performs the program operation in the TLC method, after the MSB page data is programmed in the specific program loops, the CSB page data and the LSB page data may be sequentially programmed.

Figure 12:
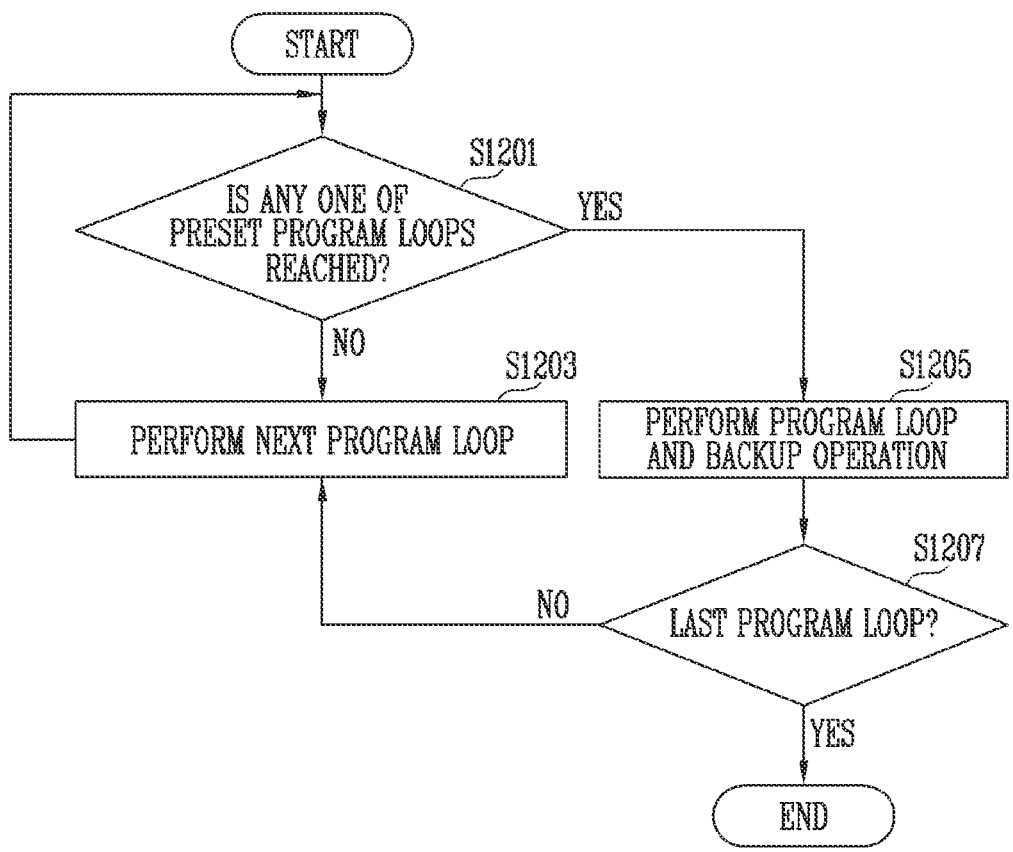
FIG. 12 is a diagram illustrating an operation of a memory device according to an embodiment of the present disclosure.

FIG. 12 is a diagram illustrating an operation of a memory device according to an embodiment of the present disclosure.

Referring to FIG. 12, in step S1201, the memory device may determine any one of preset program loops is reached. That is, the memory device may determine whether it is a sequence at which preset program loops are performed among the plurality of program loops performed when programming the selected memory cells. The word "preset" as used herein with respect to a parameter, such as a preset program loops or loop and preset backup read voltage or voltages, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When any one of the preset program loops is not reached (NO), the operation may proceed to step S1203, and when any one of the preset program loops is reached (YES), the operation may proceed to step S1205.

In an embodiment, when any one of the preset program loops is not reached (NO), the memory device may perform the next program loop in step S1203. At this time, since the preset program loops are not reached, only the program operation on the selected memory cells may be performed without the backup operation on the program data.

After performing the next program loop, the memory device may proceed to step S1201 again to determine whether any one of the preset program loops is reached.

In an embodiment, when any one of the preset program loops is reached (YES), the memory device may perform the program loop and the backup operation in step S1205. That is, since any one of the preset program loops is reached, the memory device may back up the program data in the backup block simultaneously with programming the program data in the selected memory cells.

At this time, when the memory device performs the program operation in the TLC method, the backed up data may be any one of the LSB page data, the CSB page data, and the MSB page data.

In step S1207, the memory device may determine whether the program loop performed in step S1205 is a last program loop among the plurality of program loops. When the program loop performed in step S1205 is not the last program loop among the plurality of program loops (NO), the operation may proceed to step S1203 again, and the memory device may perform the next program loop.

Figure 13:
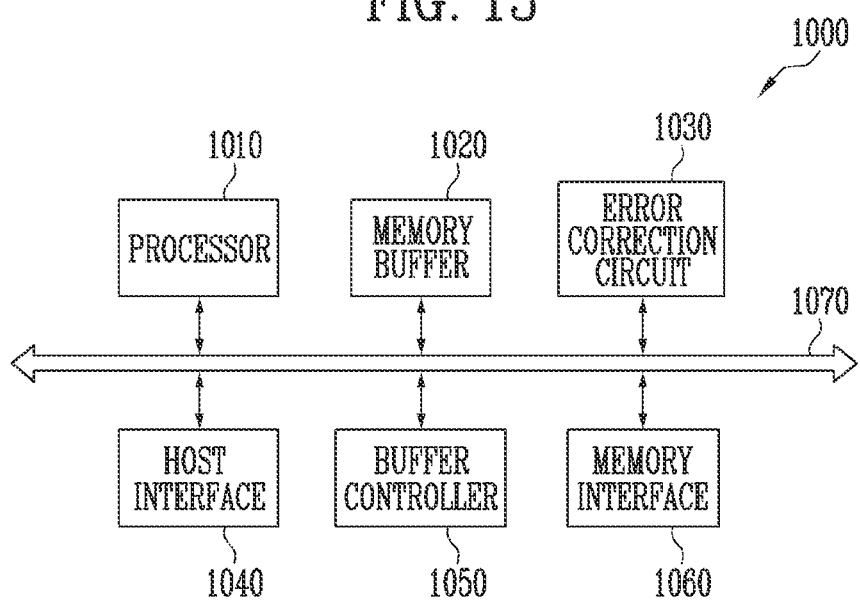
FIG. 13 is a diagram illustrating another embodiment of a memory controller of FIG. 1.

FIG. 13 is a diagram illustrating another embodiment of the memory controller of FIG. 1.

The memory controller 1000 is connected to a host and the memory device. The memory controller 1000 is configured to access the memory device in response to the request from the host. For example, the memory controller 1000 is configured to control write, read, erase, and background operations of the memory device. The memory controller 1000 is configured to provide an interface between the memory device and the host. The memory controller 1000 is configured to drive firmware for controlling the memory device.

Referring to FIG. 13, the memory controller 1000 may include a processor 1010, a memory buffer 1020, an error correction circuit (ECC) 1030, a host interface 1040, a buffer controller (or buffer control circuit) 1050, a memory interface 1060, and a bus 1070.

The bus 1070 may be configured to provide a channel between components of the memory controller 1000.

The processor 1010 may control overall operations of the memory controller 1000 and may perform a logical operation. The processor 1010 may communicate with an external host through the host interface 1040 and communicate with the memory device through the memory interface 1060. In addition, the processor 1010 may communicate with the memory buffer 1020 through the buffer controller 1050. The processor 1010 may control an operation of the storage device using the memory buffer 1020 as an operation memory, a cache memory, or a buffer memory.

The processor 1010 may perform a function of the FTL. The processor 1010 may translate the LBA provided by the host into the PBA through the FTL. The FTL may receive the LBA by using a mapping table and translate the LBA into the PBA. An address mapping method of the flash translation layer include a plurality of mapping methods according to a mapping unit. A representative address mapping method includes a page mapping method, a block mapping method, and a hybrid mapping method.

The processor 1010 is configured to randomize data received from the host. For example, the processor 1010 may randomize the data received from the host using a randomizing seed. The randomized data is provided to the memory device as data to be stored and is programmed to the memory cell array.

The processor 1010 may perform the randomization and the de-randomization by driving software or firmware.

The memory buffer 1020 may be used as an operation memory, a cache memory, or a buffer memory of the processor 1010. The memory buffer 1020 may store codes and commands executed by the processor 1010. The memory buffer 1020 may store data processed by the processor 1010. The memory buffer 1020 may include a static RAM (SRAM) or a dynamic RAM (DRAM).

The error correction circuit 1030 may perform error correction. The error correction circuit 1030 may perform error correction encoding (ECC encoding) based on data to be written to the memory device through memory interface 1060. The error correction encoded data may be transferred to the memory device through the memory interface 1060. The error correction circuit 1030 may perform error correction decoding (ECC decoding) on the data received from the memory device through the memory interface 1060. For example, the error correction circuit 1030 may be included in the memory interface 1060 as a component of the memory interface 1060.

The host interface 1040 is configured to communicate with an external host under control of the processor 1010. The host interface 1040 may be configured to perform communication using at least one of various communication methods such as a universal serial bus (USB), a serial AT attachment (SATA), a serial attached SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), and a load reduced DIMM (LRDIMM).

The buffer controller 1050 is configured to control the memory buffer 1020 under the control of the processor 1010.

The memory interface 1060 is configured to communicate with the memory device under the control of the processor 1010. The memory interface 1060 may communicate a command, an address, and data with the memory device through a channel.

For example, the memory controller 1000 might not include the memory buffer 1020 and the buffer controller 1050.

For example, the processor 1010 may control the operation of the memory controller 1000 using codes. The processor 1010 may load the codes from a nonvolatile memory device (for example, a read only memory) provided inside the memory controller 1000. As another example, the processor 1010 may load the codes from the memory device through the memory interface 1060.

For example, the bus 1070 of the memory controller 1000 may be divided into a control bus and a data bus. The data bus may be configured to transmit data within the memory controller 1000 and the control bus may be configured to transmit control information such as a command and an address within the memory controller 1000. The data bus and the control bus may be separated from each other and might not interfere with each other or affect each other. The data bus may be connected to the host interface 1040, the buffer controller 1050, the error correction circuit 1030, and the memory interface 1060. The control bus may be connected to the host interface 1040, the processor 1010, the buffer controller 1050, the memory buffer 1202, and the memory interface 1060.

Figure 14:
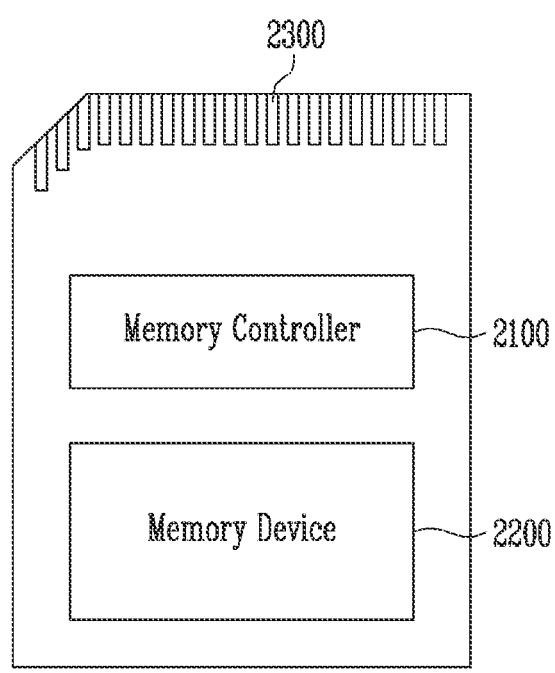
FIG. 14 is a block diagram illustrating a memory card system to which a storage device according to an embodiment of the present disclosure is applied.

FIG. 14 is a block diagram illustrating a memory card system to which the storage device according to an embodiment of the present disclosure is applied.

Referring to FIG. 14, the memory card system 2000 includes a memory controller 2100, a memory device 2200, and a connector 2300.

The memory controller 2100 is connected to the memory device 2200. The memory controller 2100 is configured to access the memory device 2200. For example, the memory controller 2100 is configured to control read, write, erase, and background operations of the memory device 2200. The memory controller 2100 is configured to provide an interface between the memory device 2200 and the host. The memory controller 2100 is configured to drive firmware for controlling the memory device 2200. The memory device 2200 may be implemented identically to the memory device 100 of FIG. 1 described with reference to FIG. 1.

As an example, the memory controller 2100 may include components such as a random access memory (RAM), a processor, a host interface, a memory interface, and an error correction circuit.

The memory controller 2100 may communicate with an external device through the connector 2300. The memory controller 2100 may communicate with an external device (for example, the host) according to a specific communication standard. As an example, the memory controller 2100 is configured to communicate with an external device through at least one of various communication standards such as a universal serial bus (USB), a multimedia card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe. As an example, the connector 2300 may be defined by at least one of the various communication standards described above.

As an example, the memory device 2200 may be implemented as various nonvolatile memory elements such as an electrically erasable and programmable ROM (EEPROM), a NAND flash memory, a NOR flash memory, a phase-change RAM (PRAM), a resistive RAM (ReRAM), a ferroelectric RAM (FRAM), and a spin transfer torque magnetic RAM (STT-MRAM).

The memory controller 2100 and the memory device 2200 may be integrated into one semiconductor device to configure a memory card. For example, the memory controller 2100 and the memory device 2200 may be integrated into one semiconductor device to configure a memory card such as a PC card (personal computer memory card international association (PCMCIA)), a compact flash card (CF), a smart media card (SM or SMC), a memory stick, a multimedia card (MMC, RS-MMC, MMCmicro, or eMMC), an SD card (SD, miniSD, microSD, or SDHC), and a universal flash storage (UFS).

In an embodiment, the memory device 2200 may perform the plurality of program loops to program the program data in the selected memory cells. At this time, the memory device 2200 may perform the backup operation together in the specific program loops among the plurality of program loops.

For example, the memory device 2200 may preset program loops to be performed together with the backup operation among the plurality of program loops. Thereafter, when the memory device 2200 performs the preset program loops, some of the program data may be programmed in the backup block simultaneously with programming the selected memory cells.

For example, assuring that the memory device 2200 programs the selected memory cells in the TLC method, the program data may include the LSB page data, the CSB page data, and the MSB page data. Therefore, when the memory device 2200 performs the preset program loops, any one of the LSB page data, the CSB page data, and the MSB page data may be backed up in the backup block simultaneously with programming the selected memory cells. At this time, the LSB page data, the CSB page data, and the MSB page data may be programmed in different backup blocks.

Thereafter, when the memory device 2200 performs the preset program loops again, some of the program data may be programmed in the backup block simultaneously with programming the selected memory cells.

In an embodiment, when the program fail occurs after all program data is programmed in the backup block, the memory device 2200 may recover the program data by reading the data programmed in the backup block. At this time, the memory device 2200 may preset read voltages for reading the data programmed in the backup block to a level different from that of read voltages for distinguishing the program states.

As a result, since the memory device 2200 performs the backup operation together with the specific program loops, a separate time for backing up the program data is not consumed, and thus the time consumed for the program operation may be shortened.

Figure 15:
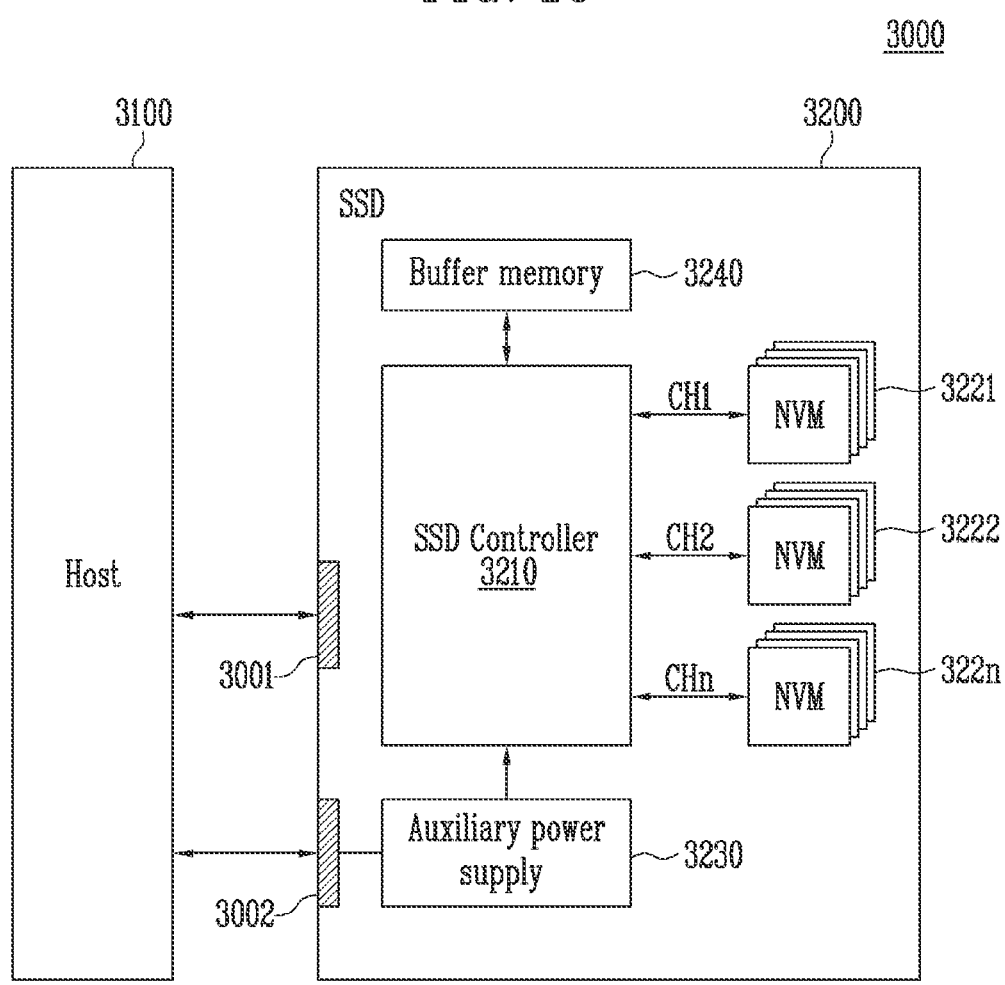
FIG. 15 is a block diagram illustrating, for example, a solid state drive (SSD) system to which a storage device according to an embodiment of the present disclosure is applied.

FIG. 15 is a block diagram illustrating, for example, a solid state drive (SSD) system to which the storage device according to an embodiment of the present disclosure is applied.

Referring to FIG. 15, the SSD system 3000 includes a host 3100 and an SSD 3200. The SSD 3200 exchanges a signal SIG with the host 3100 through a signal connector 3001 and receives power PWR through a power connector 3002. The SSD 3200 includes an SSD controller 3210, a plurality of flash memories 3221 to 322n, an auxiliary power device 3230, and a buffer memory 3240.

In an embodiment, the SSD controller 3210 may perform a function of the memory controller 200 of FIG. 1 described with reference to FIG. 1.

The SSD controller 3210 may control the plurality of flash memories 3221 to 322n in response to the signal SIG received from the host 3100. As an example, the signal SIG may be signals based on an interface between the host 3100 and the SSD 3200. For example, the signal SIG may be a signal defined by at least one of interfaces such as a universal serial bus (USB), a multi-media card (MMC), an embedded MMC (eMMC), a peripheral component interconnection (PCI), a PCI express (PCI-E), an advanced technology attachment (ATA), a serial-ATA, a parallel-ATA, a small computer system interface (SCSI), an enhanced small disk interface (ESDI), integrated drive electronics (IDE), FireWire, a universal flash storage (UFS), Wi-Fi, Bluetooth, and an NVMe.

The auxiliary power device 3230 is connected to the host 3100 through the power connector 3002. The auxiliary power device 3230 may receive the power PWR from the host 3100 and may charge the power. The auxiliary power device 3230 may provide power of the SSD 3200 when power supply from the host 3100 is not smooth. As an example, the auxiliary power device 3230 may be positioned in the SSD 3200 or may be positioned outside the SSD 3200. For example, the auxiliary power device 3230 may be positioned on a main board and may provide auxiliary power to the SSD 3200.

The buffer memory 3240 operates as a buffer memory of the SSD 3200. For example, the buffer memory 3240 may temporarily store data received from the host 3100 or data received from the plurality of flash memories 3221 to 322n, or may temporarily store metadata (for example, a mapping table) of the flash memories 3221 to 322n. The buffer memory 3240 may include a volatile memory such as a DRAM, an SDRAM, a DDR SDRAM, an LPDDR SDRAM, and a GRAM, or a nonvolatile memory such as an FRAM, a ReRAM, an STT-MRAM, and a PRAM.

In an embodiment, the SSD 3200 may perform the plurality of program loops to program the program data in the selected memory cells among memory cells included in each of the plurality of flash memories 3221 to 322n. At this time, the SSD 3200 may perform the backup operation together in the specific program loops among the plurality of program loops.

For example, the SSD 3200 may preset program loops to be performed together with the backup operation among the plurality of program loops. Thereafter, when the SSD 3200 performs the preset program loops, some of the program data may be programmed in the backup block simultaneously with programming the selected memory cells.

For example, assuming that the SSD 3200 programs the selected memory cells in the TLC method, the program data may include the LSB page data, the CSB page data, and the MSB page data. Therefore, when the SSD 3200 performs the preset program loops, any one of the LSB page data, the CSB page data, and the MSB page data may be backed up in the backup block simultaneously with programming the selected memory cells. At this time, the LSB page data, the CSB page data, and the MSB page data may be programmed in different backup blocks.

Thereafter, when the SSD 3200 performs the preset program loops again, some of the program data may be programmed in the backup block simultaneously with programming the selected memory cells.

In an embodiment, when the program fail occurs after all program data is programmed in the backup block, the SSD 3200 may recover the program data by reading the data programmed in the backup block. At this time, the SSD 3200 may preset read voltages for reading the data programmed in the backup block to a level different from that of read voltages for distinguishing the program states.

As a result, since the SSD 3200 performs the backup operation together with the specific program loops, a separate time for backing up the program data is not consumed, and thus the time consumed for the program operation may be shortened.

FIG. 16 is a block diagram illustrating a user system to which the storage device according to an embodiment of the present disclosure is applied.

Referring to FIG. 16, the user system 4000 includes an application processor 4100, a memory module 4200, a network module 4300, a storage module 4400, and a user interface 4500.

The application processor 4100 may drive components, an operating system (OS), a user program, or the like included in the user system 4000. For example, the application processor 4100 may include controllers, interfaces, graphics engines, and the like that control the components included in the user system 4000. The application processor 4100 may be provided as a system-on-chip (SoC).

The memory module 4200 may operate as a main memory, an operation memory, a buffer memory, or a cache memory of the user system 4000. The memory module 4200 may include a volatile random access memory such as a DRAM, an SDRAM, a DDR SDRAM, a DDR2 SDRAM, a DDR3 SDRAM, an LPDDR SDARM, an LPDDR2 SDRAM, and an LPDDR3 SDRAM, or a nonvolatile random access memory, such as a PRAM, a ReRAM, an MRAM, and an FRAM. For example, the application processor 4100 and memory module 4200 may be packaged based on a package on package (POP) and provided as one semiconductor package.

The network module 4300 may communicate with external devices. For example, the network module 4300 may support wireless communication such as code division multiple access (CDMA), global system for mobile communications (GSM), wideband CDMA (WCDMA), CDMA-2000, time division multiple access (TDMA), long term evolution, Wimax, WLAN, UWB, Bluetooth, and WI-FI. For example, the network module 4300 may be included in the application processor 4100.

The storage module 4400 may store data. For example, the storage module 4400 may store data received from the application processor 4100. Alternatively, the storage module 4400 may transmit data stored in the storage module 4400 to the application processor 4100. For example, the storage module 4400 may be implemented as a nonvolatile semiconductor memory element such as a phase-change RAM (PRAM), a magnetic RAM (MRAM), a resistive RAM (RRAM), a NAND flash, a NOR flash, and a three-dimensional NAND flash. For example, the storage module 4400 may be provided as a removable storage device (removable drive), such as a memory card, and an external drive of the user system 4000.

For example, the storage module 4400 may include a plurality of nonvolatile memory devices, and the plurality of nonvolatile memory devices may operate identically to the memory device described with reference to FIGS. 2 and 3. The storage module 4400 may operate identically or similarly to the storage device 50 described with reference to FIG. 1.

The user interface 4500 may include interfaces for inputting data or an instruction to the application processor 4100 or for outputting data to an external device. For example, the user interface 4500 may include user input interfaces such as a keyboard, a keypad, a button, a touch panel, a touch screen, a touch pad, a touch ball, a camera, a microphone, a gyroscope sensor, a vibration sensor, and a piezoelectric element. The user interface 4500 may include user output interfaces such as a liquid crystal display (LCD), an organic light emitting diode (OLED) display device, an active matrix OLED (AMOLED) display device, an LED, a speaker, and a monitor.

In an embodiment, the storage module 4400 may perform the plurality of program loops to program the program data in the selected memory cells. At this time, the storage module 4400 may perform the backup operation together in the specific program loops among the plurality of program loops.

For example, the storage module 4400 may preset program loops to be performed together with the backup operation among the plurality of program loops. Thereafter, when the storage module 4400 performs the preset program loops, some of the program data may be programmed in the backup block simultaneously with programming the selected memory cells.

For example, assuming that the storage module 4400 programs the selected memory cells in the TLC method, the program data may include the LSB page data, the CSB page data, and the MSB page data. Therefore, when the storage module 4400 performs the preset program loops, any one of the LSB page data, the CSB page data, and the MSB page data may be backed up in the backup block simultaneously with programming the selected memory cells. At this time, the LSB page data, the CSB page data, and the MSB page data may be programmed in different backup blocks.

Thereafter, when the storage module 4400 performs the preset program loops again, some of the program data may be programmed in the backup block simultaneously with programming the selected memory cells.

In an embodiment, when the program fail occurs after all program data is programmed in the backup block, the storage module 4400 may recover the program data by reading the data programmed in the backup block. At this time, the storage module 4400 may preset read voltages for reading the data programmed in the backup block to a level different from that of read voltages for distinguishing the program states.

As a result, since the storage module 4400 performs the backup operation together with the specific program loops, a separate time for backing up the program data is not consumed, and thus the time consumed for the program operation may be shortened.

What is claimed is:

1. A memory device comprising:
   a memory block including a main sub block including selected memory cells in which program data is programmed among a plurality of memory cells respectively connected to a plurality of word lines, and a backup block in which page data included in the program data is backed up;
   a peripheral circuit configured to perform a plurality of program loops to program the program data in the selected memory cells; and
   control logic configured to control the peripheral circuit to back up any one of the page data while programming the selected memory cells in preset program loops among the plurality of program loops.

2. The memory device of claim 1, wherein when the selected memory cells are programmed in a triple level cell method, the page data includes least significant bit page data, center significant bit page data, and most significant bit page data.

3. The memory device of claim 1, wherein the control logic controls to erase the memory block before the plurality of program loops are performed.

4. The memory device of claim 1, wherein the control logic controls to erase the backup blocks after the plurality of program loops are ended.

5. The memory device of claim 1, wherein the control logic sets a program mode for programming the program data based on whether the preset program loops are reached, and the program mode is any one of a normal mode for performing the plurality of program loops on the selected memory cells, and a backup mode for performing a backup operation of backing up any one of the page data while performing the plurality of program loops on the selected memory cells.

6. The memory device of claim 5, wherein the control logic sets the program mode to the backup mode in the preset program loops.

7. The memory device of claim 6, wherein the control logic controls to program any one of the page data in memory cells connected to a selected word line among memory cells of the backup block, when a program voltage is applied to the selected word line to which the selected memory cells are connected, in the backup mode.

8. The memory device of claim 7, wherein the control logic controls to program any one of the page data using a single level cell method.

9. The memory device of claim 7, wherein the control logic controls a voltage level of bit lines respectively connected to memory cells connected to the selected word line among the memory cells of the backup block so that any one of the page data is programmed to the backup block.

10. The memory device of claim 1, wherein the control logic recovers the program data by reading the page data backed up in the backup block when a program is failed after performing the plurality of program loops.

11. The memory device of claim 10, wherein the control logic reads preset backup read voltages to read page data.

12. A memory device comprising:
a memory block including a main sub block including selected memory cells in which program data is programmed among a plurality of memory cells respectively connected to a plurality of word lines, and a backup block in which page data included in the program data is backed up;
a peripheral circuit configured to perform a plurality of program loops to program the program data in the selected memory cells;
an erase controller configured to control an erase operation on the backup blocks before the plurality of program loops are performed or after all of the plurality of program loops are performed;
a program loop counter configured to count the number of times the plurality of program loops are performed;
a mode setting component configured to set a program mode for programming the program data based on the number of program loops counted by the program loop counter; and
a backup performing component configured to control the peripheral circuit to back up any one of the page data while programming the selected memory cells in preset program loops among the plurality of program loops.

13. The memory device of claim 12, wherein the program mode is any one of a normal mode for performing the plurality of program loops on the selected memory cells and a backup mode for performing a backup operation of backing up any one of the page data while performing the plurality of program loops on the selected memory cells, and
the mode setting component sets the program mode to the backup mode in the preset program loops.

14. The memory device of claim 13, wherein the backup performing component controls to program any one of the page data in memory cells connected to a selected word line among memory cells of the backup block, when a program voltage is applied to the selected word line to which the selected memory cells are connected, in the backup mode.

15. The memory device of claim 14, wherein the backup performing component controls a voltage level of bit lines respectively connected to the memory cells connected to the selected word line among the memory cells of the backup block so that any one of the page data is programmed in the backup block.

16. A method of operating a memory device comprising a memory block including a main sub block including selected memory cells in which program data is programmed among a plurality of memory cells respectively connected to a plurality of word lines, and backup blocks in which page data included in the program data is backed up, the method comprising:
performing a plurality of program loops to program the program data in the selected memory cells; and
backing up any one of the page data while programming the selected memory cells when preset program loops among the plurality of program loops are performed.

17. The method of claim 16, wherein in backing up, one of the page data is programmed in memory cells connected to a selected word line among memory cells of the backup block, when a program voltage is applied to the selected word line to which the selected memory cells are connected.

18. The method of claim 16, wherein in backing up, any one of the page data is programmed in a single level cell method.

19. The method of claim 16, wherein in backing up, a voltage level of bit lines respectively connected to memory cells connected to a selected word line among memory cells of the backup block is set so that any one of the page data is programmed in the backup block.

20. The method of claim 16, wherein the program data is recovered by reading the page data backed up in the backup block with preset backup read voltages, when a program is failed after performing the plurality of program loops.

* * * * *